United States Patent
Muramoto et al.

(10) Patent No.: US 10,095,105 B2
(45) Date of Patent: Oct. 9, 2018

(54) METHOD FOR MANUFACTURING MASTER, TRANSFER COPY, AND REPLICA MASTER

(71) Applicant: DEXERIALS CORPORATION, Tokyo (JP)

(72) Inventors: Yutaka Muramoto, Miyagi (JP); Masanao Kikuchi, Miyagi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/326,163

(22) PCT Filed: Jul. 14, 2015

(86) PCT No.: PCT/JP2015/070167
§ 371 (c)(1),
(2) Date: Jan. 13, 2017

(87) PCT Pub. No.: WO2016/013452
PCT Pub. Date: Jan. 28, 2016

(65) Prior Publication Data
US 2017/0205707 A1   Jul. 20, 2017

(30) Foreign Application Priority Data
Jul. 25, 2014   (JP) ................. 2014-151757

(51) Int. Cl.
*G03F 7/00* (2006.01)
*C23C 14/08* (2006.01)
(Continued)

(52) U.S. Cl.
CPC ........ *G03F 7/0002* (2013.01); *B29C 33/3857* (2013.01); *C23C 14/083* (2013.01);
(Continued)

(58) Field of Classification Search
CPC .......... C23C 14/08; C23C 14/34; C23C 16/27; C23C 16/44; C23C 16/56; C23C 28/046;
(Continued)

(56) References Cited

U.S. PATENT DOCUMENTS

| 9,588,259 B2 * | 3/2017 | Hayashibe .............. G02B 1/118 |
| 2009/0170010 A1 * | 7/2009 | Belleson ................. B82Y 10/00 430/5 |

(Continued)

FOREIGN PATENT DOCUMENTS

| CN | 101952093 A | 1/2011 |
| CN | 102804110 A | 11/2012 |

(Continued)

OTHER PUBLICATIONS

Jun. 22, 2018, Chinese Office Action issued for related CN Application No. 201580039855.8.

*Primary Examiner* — Lan Vinh
(74) *Attorney, Agent, or Firm* — Paratus Law Group, PLLC

(57) ABSTRACT

There is provided a method for manufacturing a master on which an arbitrary pattern is formed, the method including: forming a thin-film layer on an outer circumferential surface of a base material in a round cylindrical or round columnar shape; generating a control signal corresponding to an object on the basis of an input image in which the object is depicted; irradiating the thin-film layer with laser light on the basis of the control signal and thereby forming a thin-film pattern corresponding to the object on the thin-film layer; and forming a pattern corresponding to the object on the outer circumferential surface of the base material using, as a mask, the thin-film layer on which the thin-film pattern is formed.

14 Claims, 18 Drawing Sheets

(51) Int. Cl.
    *C23C 14/34* (2006.01)
    *C23C 16/27* (2006.01)
    *C23C 16/44* (2006.01)
    *C23C 16/56* (2006.01)
    *C23C 28/04* (2006.01)
    *G03F 7/20* (2006.01)
    *B29C 33/38* (2006.01)
    *G03F 7/004* (2006.01)
    *G03F 7/11* (2006.01)
    *G03F 7/24* (2006.01)

(52) U.S. Cl.
    CPC .............. *C23C 14/34* (2013.01); *C23C 16/27* (2013.01); *C23C 16/44* (2013.01); *C23C 16/56* (2013.01); *C23C 28/046* (2013.01); *G03F 7/0043* (2013.01); *G03F 7/11* (2013.01); *G03F 7/2053* (2013.01); *G03F 7/24* (2013.01); *G03F 7/70025* (2013.01)

(58) Field of Classification Search
    CPC . C23C 14/083; G03F 7/0002; G03F 7/70025; B81C 1/00031
    USPC .... 216/7, 8, 11, 12, 24, 26; 430/5, 296, 302
    See application file for complete search history.

(56) References Cited

U.S. PATENT DOCUMENTS

| | | | |
|---|---|---|---|
| 2011/0027408 A1 | 2/2011 | Suzuki et al. | |
| 2013/0003181 A1* | 1/2013 | Hayashibe | G06F 3/041 |
| | | | 359/585 |

FOREIGN PATENT DOCUMENTS

| | | |
|---|---|---|
| JP | 2005-178052 | 7/2005 |
| JP | 2013-208797 | 11/2006 |
| JP | 2009-258751 | 11/2009 |
| JP | 2011-131453 | 7/2011 |
| JP | 2012-150445 | 8/2012 |
| JP | 2012-158178 | 8/2012 |
| JP | 2006-315347 | 10/2012 |
| JP | 2013-035243 | 2/2013 |

* cited by examiner

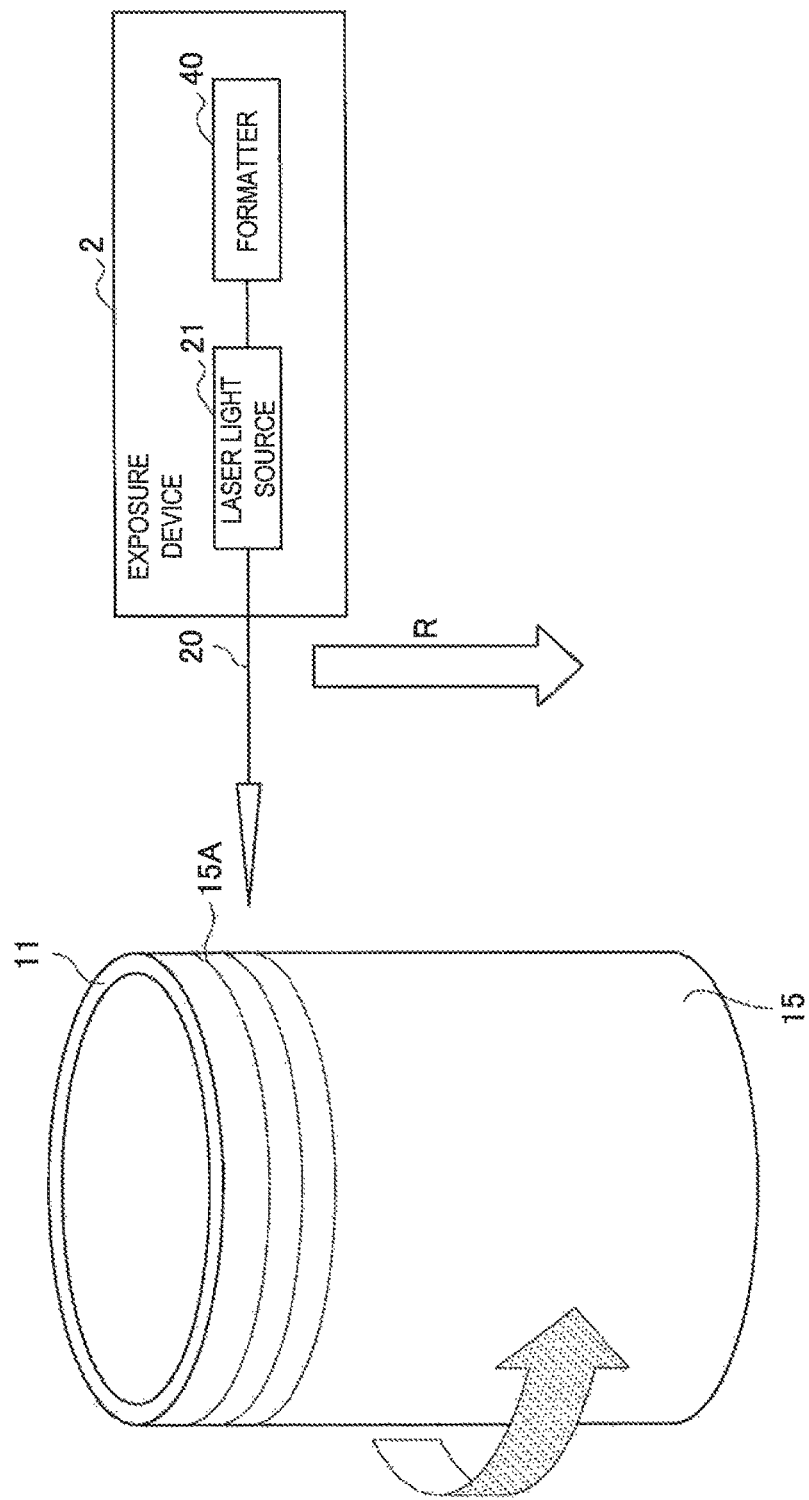

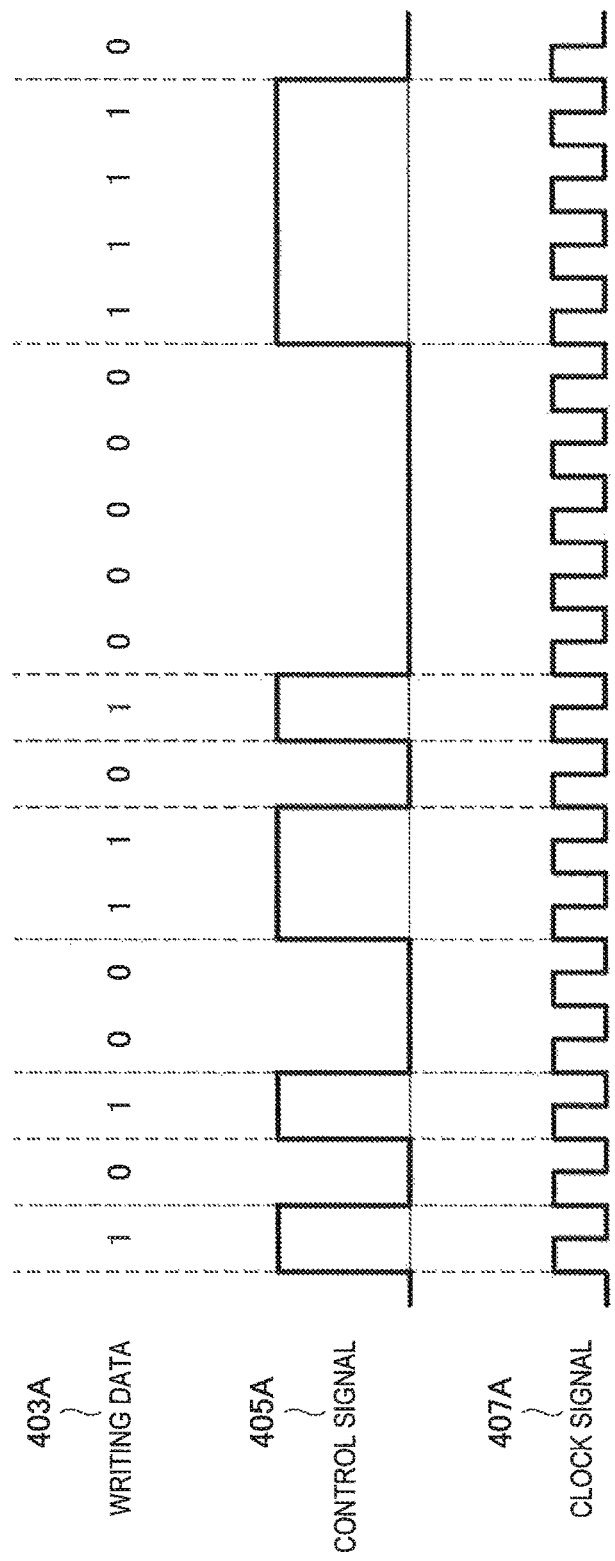

METHOD FOR MANUFACTURING MASTER, TRANSFER COPY, AND REPLICA MASTER

CROSS REFERENCE TO PRIOR APPLICATION

This application is a National Stage Patent Application of PCT International Patent Application No. PCT/JP2015/070167 (filed on Jul. 14, 2015) under 35 U.S.C. § 371, which claims priority to Japanese Patent Application No. 2014-151757 (filed on Jul. 25, 2014), which are all hereby incorporated by reference in their entirety.

TECHNICAL FIELD

The present invention relates to a method for manufacturing a master, a transfer copy, and a replica master.

BACKGROUND ART

These days, the development of nanoimprint technology in which a master in a fiat plate shape or a round columnar shape with a fine pattern formed on its surface is pressed against a resin sheet or the like and thereby the fine pattern on the master is transferred to the resin sheet or the like is in progress as a microfabrication technology.

For example, Patent Literature 1 below discloses a technology in which, using lithography by laser light, a concave-convex structure having a concave-convex cycle of less than or equal to the wavelengths in the visible light region (what is called a moth-eye structure) is formed on the outer circumferential surface of a master in a round columnar shape. Further, Patent Literature 1 discloses a technology in which the moth-eye structure formed on the outer circumferential surface of the master in a round columnar shape is transferred to a resin sheet using nanoimprint technology.

CITATION LIST

Patent Literature

Patent Literature 1:JP 2009-258751A

SUMMARY OF INVENTION

Technical Problem

However, in the technology disclosed in Patent Literature 1 above, there has been a problem that the timing of irradiating the master with laser light cannot be arbitrarily controlled. Hence, the method for manufacturing a master disclosed in Patent Literature 1 can form only a concave-convex structure of a simple pattern having periodicity on the master, and has been unable to form a concave-convex structure of an arbitrary shape on the master.

Thus, the present invention has been made in view of the issue mentioned above, and an object of the present invention is to provide a novel and improved method for manufacturing a master that can form a concave-convex structure of an arbitrary shape on a master, a transfer copy of a master manufactured by the manufacturing method, a replica master to which the transfer copy is further transferred, and a transfer copy of the replica master.

Solution to Problem

According to an aspect of the present invention in order to solve the above-mentioned problem, there is provided a method for manufacturing a master including: forming a thin-film layer on an outer circumferential surface of a base material in a round cylindrical or round columnar shape; generating a control signal corresponding to an object on the basis of an input image in which the object is depicted; irradiating the thin-film layer with laser light on the basis of the control signal and thereby forming a thin-film pattern corresponding to the object on the thin-film layer; and forming a pattern corresponding to the object on the outer circumferential surface of the base material using, as a mask, the thin-film layer on which the thin-film pattern is formed.

The input image may be divided into a plurality of small areas, whether to irradiate each of the small areas with the laser tight may be determined on the basis of whether the object is included in the small area, and the control signal may be generated on the basis of the determination result.

A size of the small area may be smaller than a size of a spot of the laser light.

The forming the thin-film pattern on the thin-film layer may include irradiating the base material with the laser light while rotating the base material with a center axis of the base material as a rotation axis.

The control signal may be generated so as to be synchronized with a signal that controls the rotation of the base material.

A light source of the laser light may be a semiconductor laser, and the thin-film pattern may be formed on the thin-film layer by thermal lithography.

The thin-film layer may include an intermediate layer formed on the outer circumferential surface and a resist layer formed on the intermediate layer, and the forming the thin-film pattern on the thin-film layer may include developing the resist layer to form the thin-film pattern on the resist layer and etching the intermediate layer using the resist layer as a mask.

An etching rate of the intermediate layer may be higher than an etching rate of the resist layer, and the etching rate of the intermediate layer may be lower than an etching rate of the base material.

A thermal conductivity of the intermediate layer may be less than or equal to 200 W/(m·K).

A difference between a reflectance of the laser light to the resist layer directly formed on the base material and a reflectance of the laser light to the resist layer formed on the base material via the intermediate layer may be less than or equal to 5%.

The resist layer may contain a metal oxide.

The intermediate layer may contain diamond-like carbon.

According to another aspect of the present invention in order to solve the above-mentioned problem, there is provided a transfer copy to which a pattern of a master manufactured by the above manufacturing method is transferred.

According to another aspect of the present invention in order to solve the above-mentioned problem, there is provided a replica master to which a pattern of the above transfer copy is transferred.

According to another aspect of the present invention in order to solve the above-mentioned problem, there is provided a transfer copy to which a pattern of the above replica master is transferred.

According to the present invention, it is possible to arbitrarily control the timing of irradiating a master with laser light in order to form a pattern.

Advantageous Effects of Invention

As described above, according to the present invention, the emission of laser light can be arbitrarily controlled, and therefore a concave-convex structure of an arbitrary shape can be formed on a master.

BRIEF DESCRIPTION OF DRAWINGS

FIG. 4 is an illustration diagram describing an overview of an exposure device used in the first manufacturing method according to the embodiment.

FIG. 7 is an illustration diagram describing a method for converting writing data to a control signal.

DESCRIPTION OF EMBODIMENTS

Figure 1:
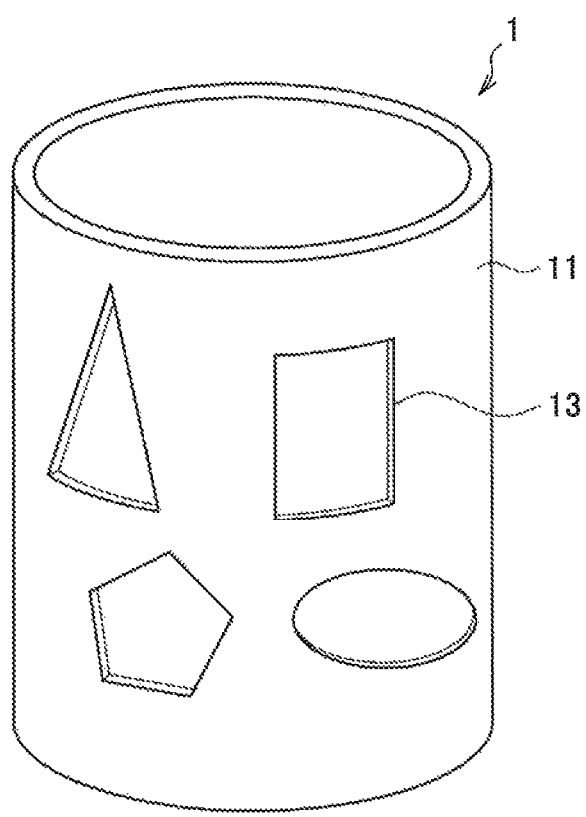
FIG. 1 is a perspective view schematically showing a master manufactured by a manufacturing method according to an embodiment of the present invention.

Hereinafter, (a) preferred embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

<1. With Regard to Master and Transfer Copy Based on Master>

First, a master manufactured by a manufacturing method according to an embodiment of the present invention and a transfer copy based on the master are described with reference to FIG. 1 and FIG. 2. FIG. 1 is a perspective view schematically showing a master manufactured by a manufacturing method according to the embodiment.

As shown in FIG. I, a master 1 manufactured by the manufacturing method according to the embodiment is formed of a base material 11 in which a concave-convex structure 13 is thrilled on its outer circumferential surface.

The base material 11 is a member in a round cylindrical shape, for example. However, the shape of the base material 11 may not only be a hollow round cylindrical shape having a hollow inside as shown in FIG. 1, but may also be a solid round columnar shape not having a hollow inside. The material of the base material 11 is not particularly limited, and quartz glass ($SiO_2$) such as fused quartz glass or synthetic quartz glass, or a metal such as stainless steel may be used. The size of the base material 11 is not particularly limited; the axial length may be more than or equal to 100 mm, the outer diameter may be more than or equal to 50 mm and less than or equal to 300 mm, and the thickness may be more than or equal to 2 mm and less than or equal to 50 mm, for example.

The concave-convex structure 13 is formed in an arbitrary shape on the outer circumferential surface of the base material 11. For example, the shape of the concave-convex structure 13 may be a figure including a curved line such as a circle or an ellipse, a polygon such as a triangle or a quadrangle, a straight line or a curved line, a character, etc. Here, the shape of the concave-convex structure 13 refers to the shape of a figure that is, when the concave-convex structure 13 is projected onto a plane parallel to the center axis of the base material 11, depicted on the projection surface by the concave-convex structure 13. That is, the shape of the concave-convex structure 13 refers to the shape in a planar view of the concave-convex structure 13.

By the method for manufacturing the master 1 according to the embodiment, the concave-convex structure 13 of the outer circumferential surface of the base material 11 can be formed with an arbitrary shape. Details of the method for manufacturing the master 1 like this according to the embodiment are described later in <2. Method for manufacturing master according to embodiment> below.

Here, the master 1 is used for a nanoimprint transfer device of a roll-to-roll system, and is a master for manufacturing a transfer copy to which the concave-convex structure 13 is transferred. For example, the master 1 can, using a transfer device 6 shown in FIG. 2, manufacture a transfer copy to which the concave-convex structure 13 formed on its outer circumferential surface is transferred.

A method for manufacturing a transfer copy using the master 1 will now be described with reference to FIG. 2. FIG. 2 is an illustration diagram describing a transfer device that manufactures a transfer copy using a master manufactured by the manufacturing method according to the embodiment.

Figure 2:
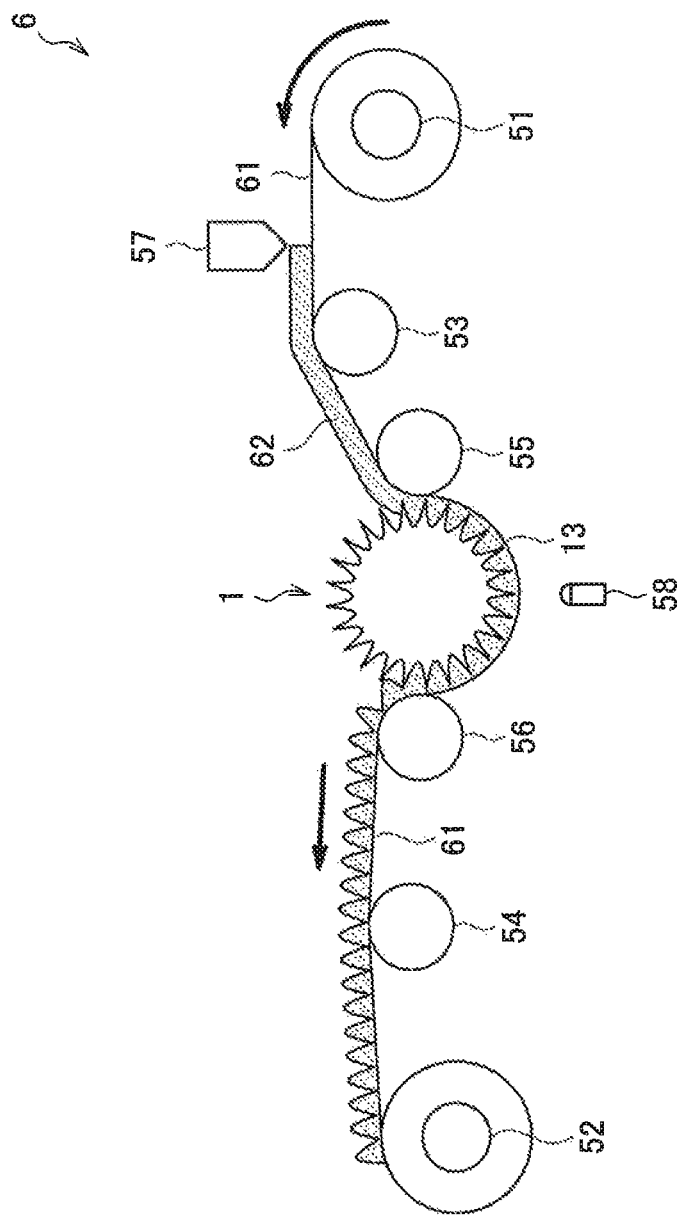
FIG. 2 is an illustration diagram describing a transfer device for manufacturing a transfer copy using a master manufactured by the manufacturing method according to the embodiment.

As shown in FIG. 2, a transfer device 6 includes the master 1, a base material supply roll 51, a take-up roll 52, guide rolls 53 and 54, a nip roll 55, a separation roll 56, an applicator device 57, and a light source 58.

The base material supply roll 51 is a roll around which a transfer destination 61 in a sheet form is wound in a roll form, and the take-up roll 52 is a roll that takes up the transfer destination 61 on which a resin layer 62 with the concave-convex structure 13 transferred thereto is laminated. The guide rolls 53 and 54 are rolls that convey the transfer destination 61. The nip roll 55 is a roll that puts the transfer destination 61 on which the resin layer 62 is laminated in close contact with the master 1 in a round cylindrical shape, and the separation roll 56 is a roll that, after the concave-convex structure 13 is transferred to the resin layer 62, separates the transfer destination 61 on which the resin layer 62 is laminated from the master 1.

The applicator device 57 includes an applicating means such as a coater, and applies a photocurable resin composition to the transfer destination 61 to form the resin layer 62. The applicator device 57 may be, for example, a gravure coater, a wire bar coater, a die coater, or the like. The light source 58 is a light source that emits light of a wavelength capable of curing the photocurable resin composition, and may be, for example, an ultraviolet lamp or the like.

The photocurable resin composition is a resin that decreases in fluidity and cures by being irradiated with light of a prescribed wavelength. Specifically, the photocurable resin composition may be an ultraviolet curable resin such as an acrylic resin or an acrylate. The photocurable resin composition may contain an initiator, a filler, a functional additive, a solvent, an inorganic material, a pigment, an antistatic agent, a sensitizing dye, etc., as necessary, In the transfer device 6, first, the transfer destination 61 is continuously fed from the base material supply roll 51 via the guide roll 53. The photocurable resin composition is applied to the fed transfer destination 61 by the applicator device 57, and thus the resin layer 62 is laminated on the transfer destination 61. The transfer destination 61 on which the resin layer 62 is laminated is put in close contact with the master 1 by the nip roll 55. Thereby, the concave-convex structure 13 formed on the outer circumferential surface of the master 1 is transferred to the resin layer 62. After the concave-convex structure 13 is transferred, the resin layer 62 is cured by being irradiated with light from the light source 58. Subsequently, the transfer destination 61 on which the cured resin layer 62 is laminated is peeled off from the master 1 by the separation roll 56, and is taken up by the take-up roll 52 via the guide roll 54, The transfer device 6 like this can continuously manufacture a transfer copy to which the concave-convex structure 13 formed on the master 1 is transferred.

The transfer copy to which the concave-convex structure 13 formed on the master 1 is transferred may be further transferred to form a replica master. The replica master coincides with the master 1 in the positions of the concavity and convexity of the concave-convex structure 13 (what is called the tone of the pattern), and can be used as a duplicate master of the master 1. The replica master may be further transferred to manufacture a transfer copy in which the concave-convex structure 13 is formed on its surface (that is, a transfer copy to which the concave-convex structure 13 is transferred three times from the master 1).

As described above, the master 1 manufactured by the manufacturing method according to the embodiment has an outer circumferential surface on which a concave-convex structure 13 having an arbitrary shape is formed, and can continuously manufacture a transfer copy to which the concave-convex structure 13 is transferred.

<2. With Regard to Method for Manufacturing Master>

Next, the method for manufacturing the master 1 according to the embodiment described above is described using a first manufacturing method and a second manufacturing method separately.

[2.1. First Manufacturing Method]

First, a first manufacturing method according to the embodiment is described with reference to FIG. 3A to FIG. 8B.

Specifically, in the first manufacturing method, a resist layer 15 (a thin-film layer) is formed on the outer circumferential surface of the base material 11. Next, a control signal corresponding to an object is generated on the basis of an input image in which the object is depicted. Subsequently, the resist layer 15 is irradiated with laser light on the basis of the control signal, and thereby a resist pattern corresponding to the object is formed on the resist layer 15. Next, the resist layer 15 is used as a mask to form a concave-convex structure 13 corresponding to the object on the base material 11. Here, the "object" refers to an arbitrary figure or the like depicted in the input image. The object may be, for example, a figure including a curved line such as a circle or an ellipse, a polygon such as a triangle or a quadrangle, a straight line or a curved line, a character, etc.

(Outline of First Manufacturing Method)

The first manufacturing method according to the embodiment will now be specifically described with reference to FIG. 3A to FIG. 3D. FIG. 3A to FIG. 3D are cross-sectional views describing each step of the first manufacturing method according to the embodiment. FIG. 3A to FIG. 3D schematically show a cross-sectional shape of the base material 11 taken along the thickness direction.

Figure 3A:
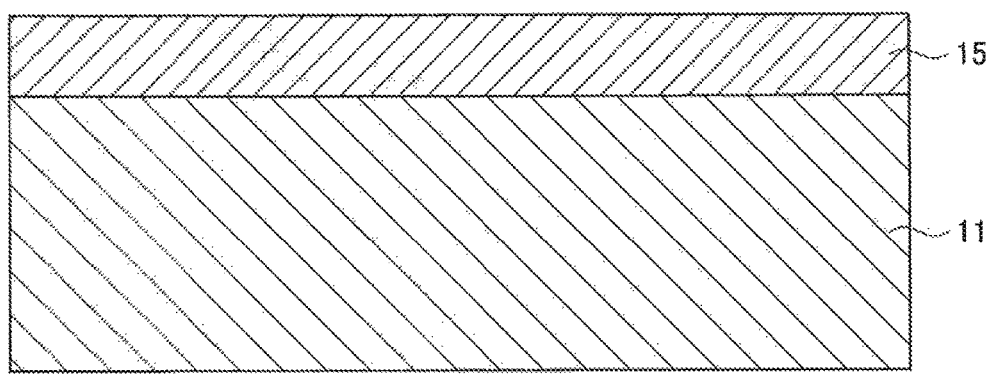
FIG. 3A is a cross-sectional view describing each step of a first manufacturing method according to the embodiment.

First, as shown in FIG. 3A, the resist layer 15 is formed as a film on the base material 11 of quartz glass or the like, for example. Here, either of an organic-based resist and an inorganic-based resist may be used for the resist layer 15. As the organic-based resist, for example, a novolac-based resist, a chemically amplified resist, or the like may be used. As the inorganic-based resist, for example, a metal oxide containing one or two or more transition metals such as tungsten or molybdenum may be used. A heat-reactive resist containing a metal oxide is preferably used for the resist layer 15 in order to perform thermal lithography.

In the case where an organic-based resist is used for the resist layer 15, the resist layer 15 may be formed as a film by using spin coating, slit coating, dip coating, spray coating, screen printing, or the like. In the case where an inorganic-based resist is used for the resist layer 15, the resist layer 15 may be formed as a film by using the sputtering method.

Figure 3B:
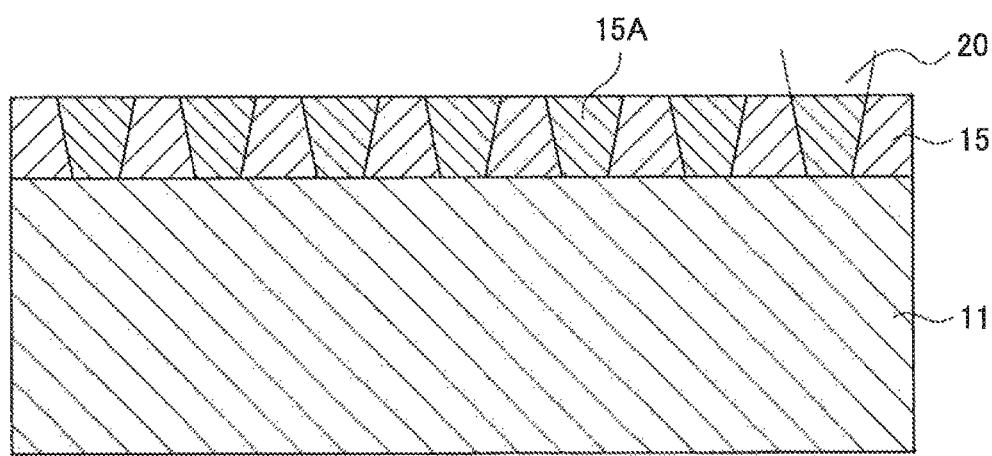
FIG. 3B is a cross-sectional view describing each step of the first manufacturing method according to the embodiment.

Next, as shown in FIG. 3B, the resist layer 15 is exposed to light by an exposure device, and a latent image 15A is formed on the resist layer 15. Specifically, the resist layer 15 is irradiated with laser light 20, and thus the part irradiated with laser light 20 of the resist layer 15 is modified; thereby, a latent image 15A is formed on the resist layer 15.

Here, in the exposure device, a control signal corresponding to an object is generated on the basis of an input image in which the object is depicted, and the irradiation of the base material 11 with laser light 20 is controlled by the control signal. Thereby, the exposure device can irradiate the position corresponding to the object on the resist layer 15 with laser light 20, and can modify the resist layer 15 in the position corresponding to the object. Specific processing at the time when the exposure device generates a control signal on the basis of an input image will be described later.

Figure 3C:
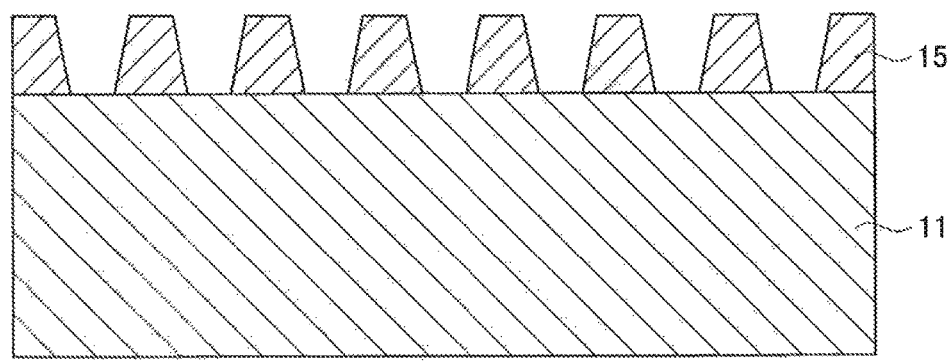
FIG. 3C is a cross-sectional view describing each step of the first manufacturing method according to the embodiment.

Subsequently, as shown in FIG. 3C, a developer is dropped onto the resist layer 15 on which the latent image 15A is formed, and the resist layer 15 is developed. Thereby, a resist pattern corresponding to the object is formed on the resist layer 15. In the case where the resist layer 15 is a positive resist, the light-exposed portion exposed to laser light 20 is larger in the rate of dissolution in the developer than the light-unexposed portion, and is therefore removed by the development processing. Thereby, a resist pattern in which the latent image 15A is removed is formed on the resist layer 15. On the other hand, in the case where the resist layer 15 is a negative resist, the light-exposed portion exposed to laser light 20 is smaller in the rate of dissolution in the developer than the light-unexposed portion, and therefore the light-unexposed portion is removed by the development processing. Thereby, a resist pattern in which the latent image 15A is left is formed on the resist layer 15.

Figure 3D:
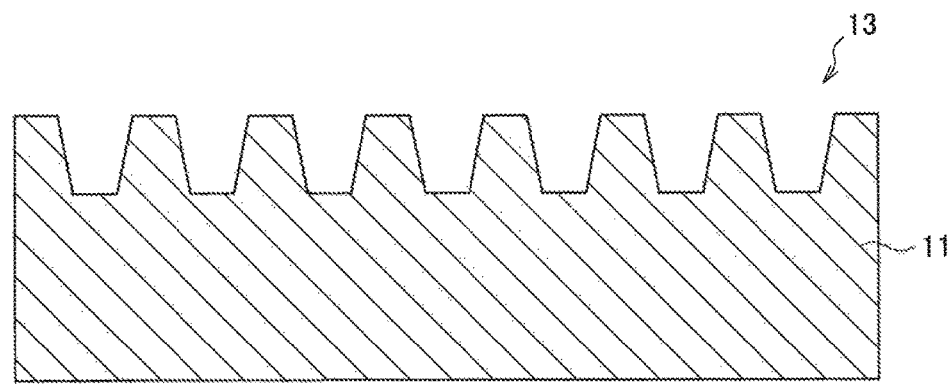
FIG. 3D is a cross-sectional view describing each step of the first manufacturing method according to the embodiment.

Next, as shown in FIG. 3D, the resist layer 15 on which a resist pattern corresponding to the object is formed in the previous step is used as a mask to etch the base material 11. Thereby, a concave-convex structure 13 corresponding to the object is formed on the base material 11. That is, the shape in a planar view of the concave-convex structure 13 coincides with the shape of the object. Either of dry etching and wet etching may be used for the etching for the base material 11. For example, in the case where the material of the base material 11 is quartz glass ($SiO_2$), dry etching using a fluorocarbon-based gas or wet etching using hydrofluoric acid or the like may be used, and thereby the base material 11 can be etched.

(Configuration of Exposure Device)

Next, the exposure device used in the first manufacturing method according to the embodiment is described in more detail with reference to FIG. 4 to FIG. 8B. FIG. 4 is an illustration diagram describing an overview of an exposure device used in the first manufacturing method according to the embodiment.

As shown in FIG. 4, an exposure device 2 used in the first manufacturing method according to the embodiment includes a laser light source 21 and a formatter 40.

The laser light source 21 is a light source that emits laser light 20, and is, for example, a solid-state laser, a semiconductor laser, or the like. The wavelength of the laser light 20 emitted by the laser light source 21 is not particularly limited, and may be a wavelength in the blue light region of 400 nm to 500 nm, for example.

The formatter 40 generates a control signal for irradiating the base material 11 with laser light 20 on the basis of an input image in which an object is depicted. For example, the formatter 40 may generate a control signal for irradiating only the position corresponding to an object on the resist layer 15 with laser light 20, and thereby a latent image 15A corresponding to an arbitrary object may be formed on the resist layer 15 on the base material 11. The formatter 40 may control the irradiation of the base material 11 with laser light 20 by controlling the emission of laser light 20, or may control the irradiation of the base material 11 with laser light 20 by controlling the irradiation position so that the base material 11 is not irradiated with laser light 20.

The exposure device 2 irradiates the resist layer 15 of the base material 11 with laser light 20 to modify the resist layer 15, and thus forms a latent image 15A. Specifically, the exposure device 2 irradiates the base material 11 with laser light 20 in a round cylindrical shape that rotates at a constant speed with the center axis as the rotation axis, while scanning the laser light 20 at a constant speed in one direction (R direction), and thus forms a latent image 15A on the entire resist layer 15. That is, the exposure device 2 exposes the resist layer 15 of the base material 11 to light in a spiral manner.

In the exposure device 2 like this, the irradiation of the base material 11 with laser light 20 is controlled on the basis of a control signal generated by the formatter 40, and thereby a latent image 15A corresponding to an object can be formed on the resist layer 15.

(Configuration of Formatter)

Figure 5:
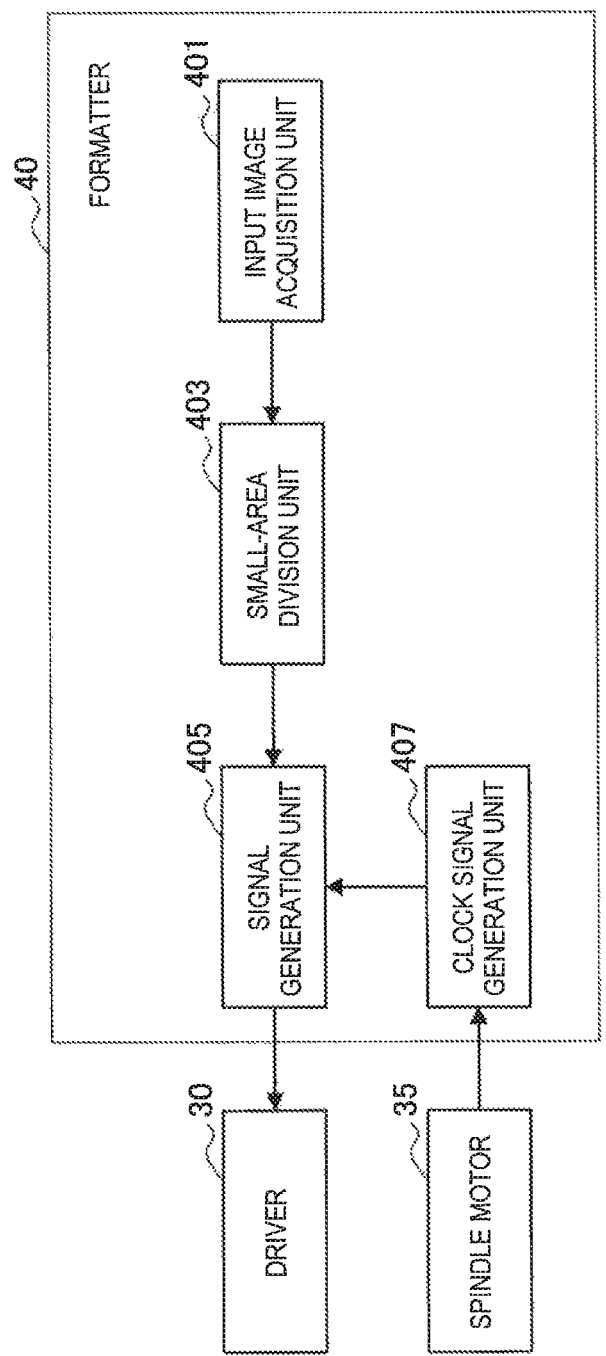
FIG. 5 is a block diagram showing a functional configuration of a formatter.

Next, the functional configuration of the formatter 40 that generates a control signal of the irradiation with laser light 20 is described with reference to FIG. 5. FIG. 5 is a block diagram showing the functional configuration of the formatter 40.

As shown in FIG. 5, the formatter 40 includes an input age acquisition unit 401, a small-area division unit 403, a signal generation unit 405, and a clock signal generation unit 407.

The input image acquisition unit 401 acquires an input image in which an object is depicted. For example, the input image in which an object is depicted is an image corresponding to a development view in which the outer circumferential surface of the base material 11 is developed in the axial direction of the base material 11 and is spread in one plane. The shape of the object depicted in the input image may be, for example, an arbitrary shape such as a figure including a curved line such as a circle or an ellipse, a polygon such as a triangle or a quadrangle, a straight line or a curved line, or a character.

The small-area division unit 403 divides an input image acquired by the input image acquisition unit 401 into small areas of a prescribed size, and assesses whether the object is included in each small area. Specifically, the small-area division unit 403 divides the input image in a direction corresponding to the axial direction of the base material 11 and a direction corresponding to the round direction of the base material 11, each at a prescribed interval, and thereby divides the input image into lattice cell-like small areas. The interval at which division is made in the direction corresponding to the axial direction of the base material 11 and the interval at which division is made in the direction corresponding to the round direction of the base material 11 may be the same or different. Further, the small-area division unit 403 assesses whether the inputted object is included in each divided small area.

Here, the size of the divided small area is preferably smaller than the size of the spot of the laser light 20. By this configuration, parts of the latent image 15A formed by being irradiated with laser light 20 can be caused to overlap without a gap between adjacent small areas. That is, by causing spots of the laser light 20 to overlap, the exposure device 2 can perform light exposure so as to paint over the position corresponding to the object. For example, when the diameter of the spot of the laser light 20 is approximately 200 nm, the interval at which division is made by the small-area division unit 403 may be 100 nm, and the divided small area may be a 100 nm×100 nm square. The shape of the small area is not limited to a lattice cell shape, and may be an arbitrary shape.

Figure 6:
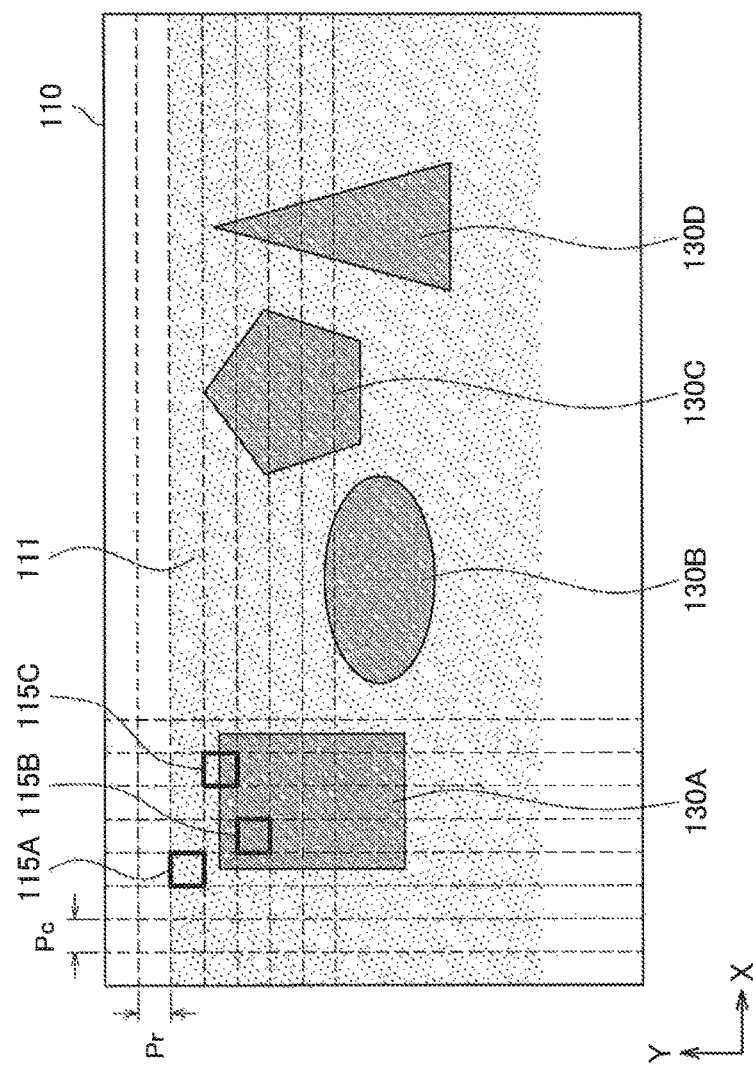
FIG. 6 is an illustration diagram describing a division of small areas on an input image in which objects are depicted.

Next, the function of the small-area division unit 403 is described more specifically with reference to FIG. 6. FIG. 6 is an illustration diagram describing the division of an input image by the small-area division unit 403. In FIG. 6, the x-direction corresponds to the round direction of the outer circumferential surface of the base material 11, and the y-direction corresponds to the axial direction of the base material 11.

As shown in FIG. 6, the small-area division unit 403 divides an input image 110 including objects 130A, 130B, 130C, and 130D at an interval of Pc in the x-direction and at an interval of Pr in the y-direction. Thereby, the input image 110 is divided into lattice cell-like small areas. Further, the small-area division unit 403 assesses whether object 130A, 130B, 130C, or 130D is included in each small area. For example, the small-area division unit 403 may assess small area 115A as a small area in which the object is not included, and may assess small areas 115B and 115C as small areas in which the object is included. The small-area division unit 403 may assess a lattice cell as the object being included therein if any part of the object is included in the lattice cell, or the small-area division unit 403 may assess a lattice cell as the object being included therein when the object is depicted in an area with a prescribed area or more in the lattice cell.

In the case where a light exposure region 111 that indicates that only a partial region of the input image 110 is to be exposed to light is set in the input image 110, the small-area division unit 403 may assess whether object 130A, 130B, 130C, or 130D is included only for the small areas included in the light exposure region 111.

The signal generation unit 405 generates a control signal that controls the irradiation with laser light 20. Specifically, the signal generation unit 405 determines, on the basis of the assessment of the small-area division unit 403, whether to irradiate each lattice cell with laser light 20, and generates, on the basis of the determination result, writing data that control the irradiation with laser light 20. Further, the signal generation unit 405 converts the writing data to a control signal using a clock signal generated by the clock signal generation unit 407. The control signal generated by the signal generation unit 405 is transmitted to a driver 30 that controls the laser light 20, and thereby the irradiation with laser light 20 is controlled.

Here, the generation of a control signal by the signal generation unit 405 is described more specifically with reference to FIG. 6 and FIG. 7. FIG. 7 is an illustration diagram describing a method for converting writing data to a control signal.

As shown in FIG. 6, the signal generation unit 405 generates writing data that control the irradiation with laser light 20 for each row in the x-direction. For example, the signal generation unit 405 selects the uppermost row of the input image 110 (or the light exposure region 111), and refers to the assessment result of each lattice cell obtained by the small-area division unit 403 sequentially from the lattice cell at the left end toward the lattice cell at the right end of this row (toward the positive side of the x-axis). "0" is assigned to the lattice cell that is assessed as not including the object by the small-area division unit 403, and "1" is assigned to the lattice cell that is assessed as including the object by the small-area division unit 403; thus, writing data are generated. Thereby, the signal generation unit 405 generates writing data from the lattice cell at the left end toward the lattice cell at the right end in the row. When the signal generation unit 405 has generated writing data up to the lattice cell at the right end of one row, the signal generation unit 405 moves to the next row below. The signal generation unit 405 performs similar processing in this row, and thereby generates writing data corresponding to this row. The signal generation unit 405 repeats the generation of writing data from the upper row toward the lower row (toward the negative side of the y-direction), and thereby generates the writing data of the entire light exposure region 111 (for example, writing data 403A shown in FIG. 7).

The direction in which the signal generation unit 405 generates writing data in each row in the x-direction is set on the basis of the rotation direction of the base material 11. Hence, depending on the rotation direction of the base material 11, the signal generation unit 405 may generate writing data for each row in the x-direction from the lattice cell at the right end toward the lattice cell at the left end (toward the negative side of the x-axis). Further, the direction in which the signal generation unit 405 generates writing data in the y-direction is set on the basis of the scanning direction of the laser light 20 with respect to the base material 11. Hence, depending on the scanning direction of the laser light 20 with respect to the base material 11, the signal generation unit 405 may generate writing data from the lower row toward the upper row (toward the positive side of the y-direction). Further, in reverse to the example mentioned above, the signal generation unit 405 may assign "1" to the lattice cell that is assessed as not including the object by the small-area division unit 403, and may assign "0" to the lattice cell that is assessed as including the object; and may thereby generate writing data.

As shown in FIG. 7, the signal generation unit 405 converts the writing data 403A generated in the above to a control signal 405A using a clock signal 407A acquired from the clock signal generation unit 407. For example, the writing data 403A are writing data in which "1" is assigned to the lattice cell that is to be irradiated with laser light 20 and "0" is assigned to the lattice cell that is not to be irradiated with laser light 20, and the clock signal 407A is a signal of a square wave having a prescribed frequency acquired from the clock signal generation unit 407.

Here, as shown in FIG. 7, the signal generation unit 405 generates the control signal 405A in such a manner that a "high" signal is assigned to the lattice cell that is assigned "1" in the writing data 403A and a "low" signal is assigned to the lattice cell that is assigned "0" in the writing data 403A, for example. Further, the signal generation unit 405 generates the control signal 405A in such a manner that the timing of the rise and fall of the signal of the control signal 405A coincides with the timing of either of the rise and fall of the signal of the clock signal 407A.

In FIG. 7, the control signal 405A is generated such that the rise and fall of the signal of the control signal 405A coincide with the rise of the signal of the clock signal 407A, for example.

The clock signal generation unit 407 generates a clock signal serving as a reference of the control signal that controls the irradiation with laser light 20. Specifically, the clock signal generation unit 407 acquires, from a spindle motor 35 that rotates the base material 11, a rotation control signal that controls the rotation, and generates, on the basis of the rotation control signal, a clock signal having a prescribed frequency serving as a reference of the control signal.

Here, the rotation rate of the spindle motor 35 that rotates the base material 11 is not necessarily constant even when a constant rotation rate is set, and fluctuates. Hence, in the case where the rotation control signal that controls the rotation of the spindle motor 35 and the control signal that controls the irradiation with laser light 20 are not in synchronization, there is a possibility that one rotation of the spindle motor 35 and one round of the control signal will not coincide. In such a case, the position irradiated with laser light 20 is shifted between rounds, and consequently there is a possibility that a pattern corresponding to the object cannot be formed accurately.

Thus, in the exposure device 2, as described above, a clock signal is generated from the rotation control signal that controls the rotation of the spindle motor 35, and a control signal that controls the irradiation with laser light 20 is generated on the basis of the clock signal; thereby, both control signals are synchronized.

The method for synchronizing the rotation control signal that controls the rotation of the spindle motor 35 and the control signal that controls the irradiation with laser light 20 is not limited to the example mentioned above. For example, the clock signal generation unit 407 may transmit a clock signal serving as a reference to both the spindle motor 35 and the signal generation unit 405. In such a case, the spindle motor 35 generates a rotation control signal that controls the rotation of the spindle motor 35 on the basis of the clock signal, and the signal generation unit 405 generates a control signal that controls the irradiation with laser light 20 on the basis of the clock signal. Also by this method, the rotation control signal that controls the rotation of the spindle motor 35 and the control signal that controls the irradiation with laser light 20 can be synchronized.

The functional configuration of the formatter 40 that generates a control signal that controls the irradiation with laser light 20 is described in the above. By the formatter 40 like this, a control signal corresponding to an arbitrary object can be generated.

The function of the formatter 40 like this can be achieved by the cooperation of software and hardware. For example, the formatter 40 may include a central processing unit (CPU), a read-only memory (ROM), a random access memory (RAM), etc. that are mutually connected by a bridge, and may achieve the function mentioned above by means of these hardware components.

For example, the CPU functions as an arithmetic processing device and a control device, and controls the overall operation in the formatter 40 in accordance with various programs. The ROM stores programs and processing parameters used by the CPU, and the RAM temporarily stores programs used in the execution of the CPU, parameters that change as appropriate in the execution, etc. Thereby, the CPU can, for example, execute the functions of the input image acquisition unit 401, the small-area division unit 403, the signal generation unit 405, and the clock signal generation unit 407.

(Examples of Configuration of Exposure Device)

Figure 8A:
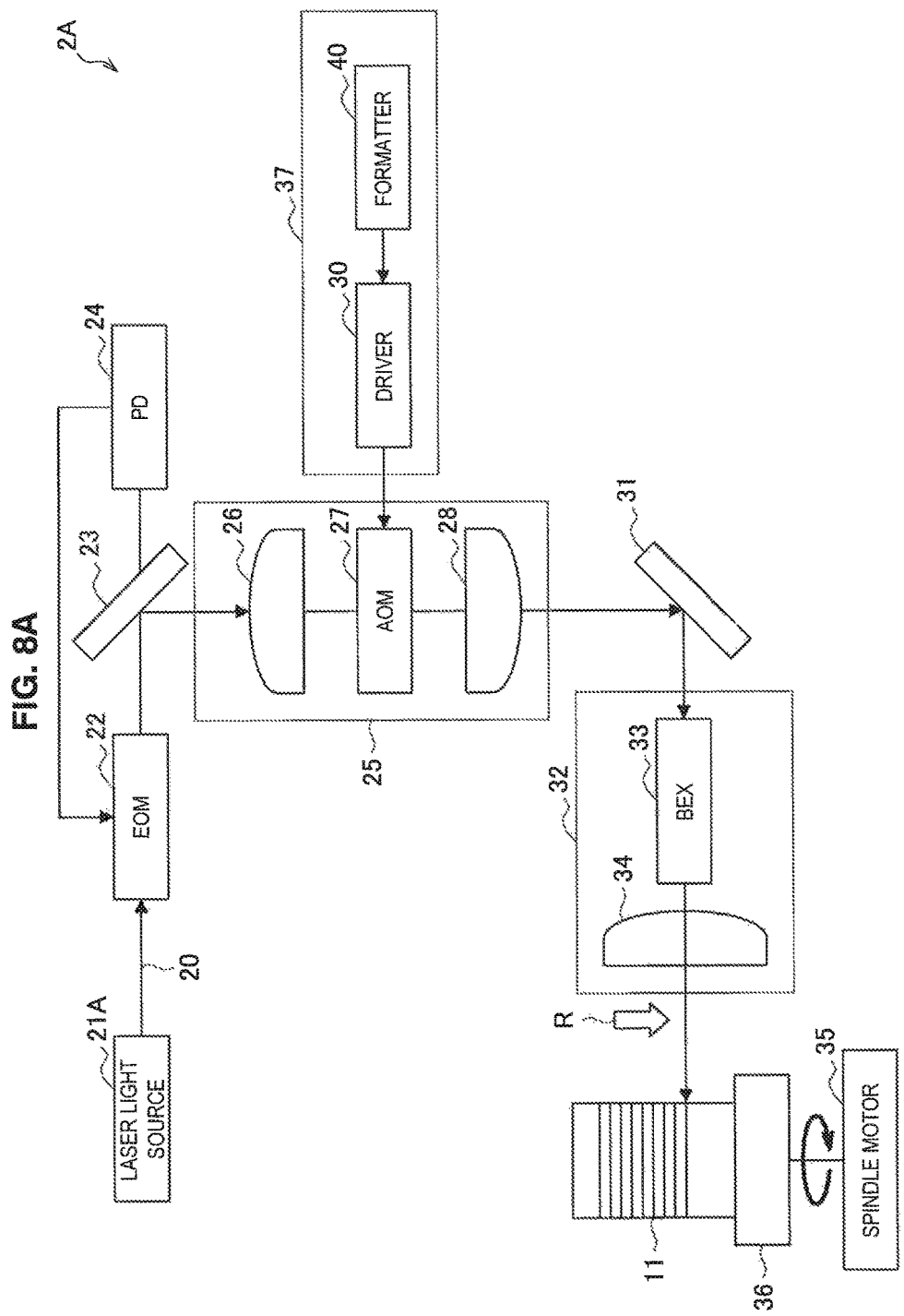
FIG. 8A is an illustration diagram showing an example configuration of the exposure device used in the first manufacturing method according to the embodiment.
Figure 8B:
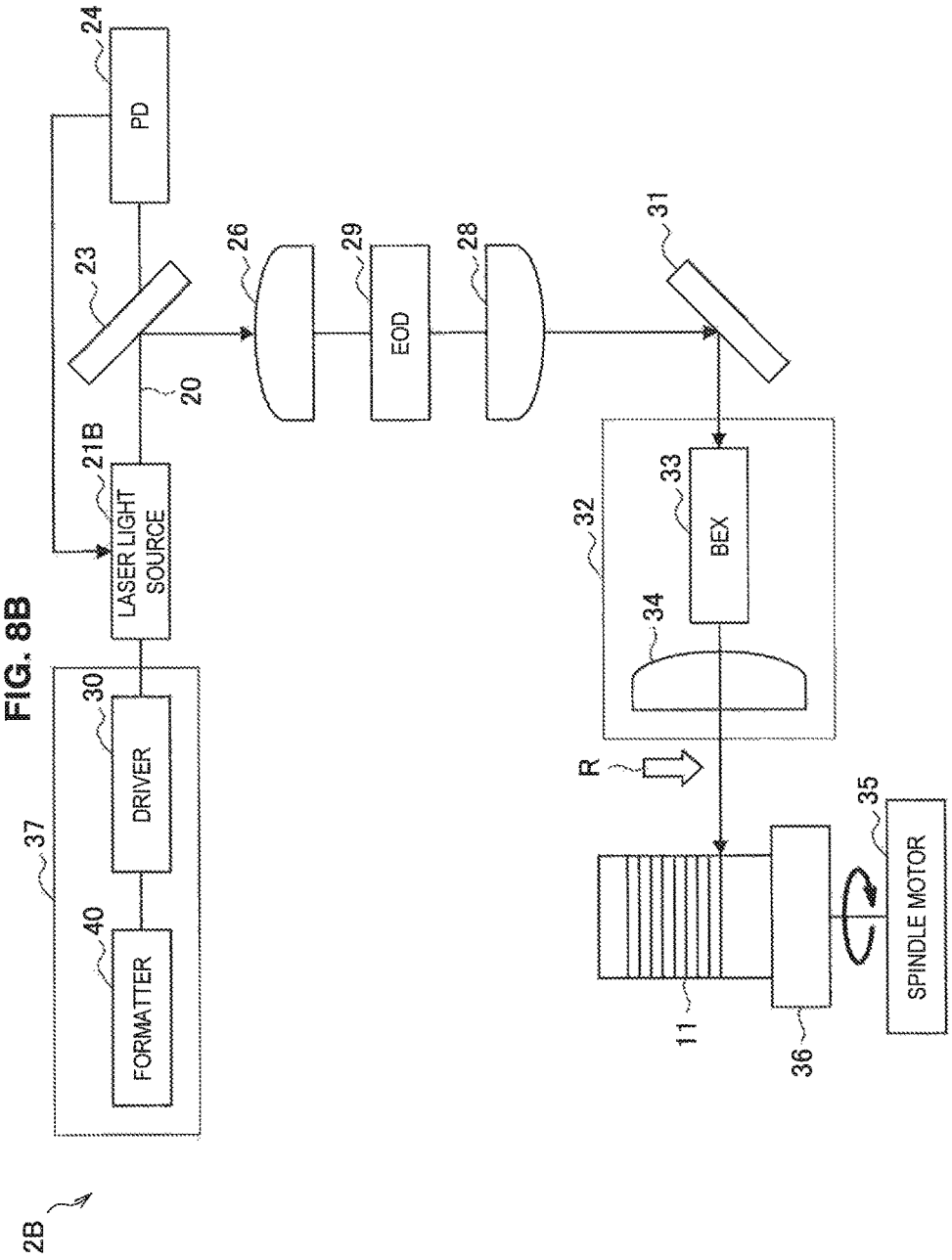
FIG. 8B is an illustration diagram showing another example configuration of the exposure device used in the first manufacturing method according to the embodiment.

Examples of the configuration of the exposure device 2 used in the first manufacturing method according to the embodiment will now be further described with reference to FIG. 8A and FIG. 8B. FIG. 8A is an illustration diagram showing an example configuration of the exposure device used in the first manufacturing method according to the embodiment. FIG. 8B is an illustration diagram showing another example configuration of the exposure device used in the first manufacturing method according to the embodiment.

First, an exposure device 2A is described with reference to FIG. 8A. The exposure device 2A is an exposure device that uses a solid-state laser as a laser light source 21A.

As shown in FIG. 8A, the exposure device 2A includes a laser light source 21A, an electro-optical element (electro-optical modulator; EOM) 22, a first mirror 23, a photodiode (PD) 24, a modulation optical system 25, a control mechanism 37, a second mirror 31, a movable optical table 32, the spindle motor 35, and a turntable 36. The base material 11 is mounted on the turntable 36 and is rotatable.

The laser light source 21A is specifically a solid-state laser. For example, a solid-state laser having a wavelength of 266 nm or the like may be used as the laser light source 21A.

The laser light 20 emitted from the laser light source 21A goes straight while remaining a parallel beam, and is incident on the electro-optical element 22. The laser light 20 transmitted through the electro-optical element 22 is reflected at the first mirror 23, and is guided to the modulation optical system 25.

The first mirror 23 is formed of a polarizing beam splitter, and has the function of reflecting one polarized component and transmitting the other polarized component. The polarized component transmitted through the first mirror 23 is received by the photodiode 24, and is photoelectrically converted. A light receiving signal photoelectrically converted by the photodiode 24 is inputted to the electro-optical element 22, and the electro-optical element 22 performs the phase modulation of the laser light 20 on the basis of the inputted light receiving signal.

The modulation optical system 25 includes a light collecting lens 26, an acousto-optic modulator (acoust-optic modulator; AOM) 27, and a collimator lens 28.

In the modulation optical system 25, the laser light 20 is collected to the acousto-optic modulator 27 made of glass ($SiO_2$) or the like by the light collecting lens 26. The laser light 20 is subjected to intensity modulation by the acousto-optic modulator 27 and diverges, and is then made into a parallel beam again by the collimator lens 28. The laser light 20 emitted from the modulation optical system 25 is reflected by the second mirror 31, and is guided onto the movable optical table 32 horizontally and parallely.

The control mechanism 37 includes the formatter 40 and the driver 30, and controls the irradiation with laser light 20. The formatter 40 generates a control signal that controls the irradiation with laser light 20 as described above, and the driver 30 controls the acousto-optic modulator 27 on the basis of the control signal generated by the formatter 40. Thereby, the irradiation of the resist layer 15 with laser light 20 is controlled.

The movable optical table 32 includes a beam expander (BEX) 33 and an objective lens 34. The laser light 20 guided to the movable optical table 32 is shaped into a desired beam shape by the beam expander 33, and is then emitted to the resist layer 15 of the outer circumferential surface of the base material 11 via the objective lens 34.

Although not illustrated, it is preferable for the exposure device 2A to be dynamically focus-controlled so that the laser light 20 always comes to a focus on the resist layer 15 on the base material 11. Specifically, during the rotation of the base material 11, the distance from the objective lens 34 to the base material 11 varies in relation to the axial runout of the rotation axis, the processing accuracy of the surface of the base material 11, etc. Thus, in order for the laser light 20 to always come to a focus on the resist layer 15 of the base material 11, it is preferable that the exposure device 2A detect the defocus of the laser light 20 and dynamically control the focus of the laser light 20. As the method for detecting the defocus of the laser light 20 with respect to the resist layer 15 on the base material 11, for example, a method of detecting the astigmatism of the reflected light of the laser light 20 with which the resist layer 15 is irradiated or the like may be used.

By the configuration of these components, the base material 11 is rotated at a constant speed on the turntable 36, and is irradiated with laser light 20 while being scanned at a constant speed in the axial direction of the base material 11; thus, the resist layer 15 is exposed to light. The scanning of laser light 20 is performed by using the movable optical table 32 to move the laser light 20 at a constant speed in the direction of arrow R.

As described above, in the exposure device 2A, the signal that controls the rotation of the spindle motor 35 and the control signal that controls the irradiation with laser light 20 are synchronized so that the actual irradiation position of laser light 20 and the irradiation position indicated by the control signal coincide (are synchronized). Thereby, the exposure device 2A can expose the resist layer 15 to light without a shift of the irradiation position of laser light 20 between rounds.

The rotation rate of the turntable 36 of the exposure device 2A and the frequency of the control signal generated by the formatter 40 are determined by the length of the outer periphery of the round cylindrical shape of the base material 11 and the division interval Pc in the round direction of the input image 110. The feed pitch of the movable optical table 32 of the exposure device 2A is determined by the division interval Pr in the axial direction of the input image 110. That is, these light exposure parameters are determined so that the irradiation position of laser light 20 coincides with the position of the divided small area of the input image 110.

Next, an exposure device 2B is described with reference to FIG. 8B. The exposure device 2B is an exposure device that uses a semiconductor laser as a laser light source 21B.

As shown in FIG. 8B, the exposure device 2B includes a laser light source 21B, the first mirror 23, the photodiode (PD) 24, the light collecting lens 26, an electro-optic deflector (EOD) 29, the collimator lens 28, the control mechanism 37, the second mirror 31, the movable optical table 32, the spindle motor 35, and the turntable 36. The base material 11 is mounted on the turntable 36 and is rotatable.

Here, the movable optical table 32, the spindle motor 35, and the turntable 36 are similar to those of the exposure device 2A described with reference to FIG. 8A, and a description herein is omitted.

The laser light source 21B is specifically a semiconductor laser. For example, a blue semiconductor laser that emits laser light of a wavelength in the blue light region of 400 nm to 500 nm may be used as the laser light source 21B. In the exposure device used in the manufacturing method according to the embodiment, a semiconductor laser is preferably used as the laser light source 21B.

The laser light 20 emitted from the laser light source 21B goes straight while remaining a parallel beam, and is reflected at the first mirror 23. The laser light 20 reflected at the first mirror 23 is collected to the electro-optic deflector 29 by the light collecting lens 26, and is then made into a parallel beam again by the collimator lens 28. The laser light 20 made into a parallel beam is reflected by the second mirror 31, and is guided onto the movable optical table 32 horizontally and parallely.

The first mirror 3 is formed of a polarizing beam splitter, and has the function of reflecting one polarized component and transmitting the other polarized component. The polarized component transmitted through the first mirror 23 is received by the photodiode 24, and is photoelectrically converted. A light receiving signal photoelectrically converted by the photodiode 24 is inputted to the laser light source 21B, and the laser light source 21B modulates the laser light 20 on the basis of the inputted light receiving signal.

The electro-optic deflector 29 is an element capable of controlling the irradiation position of laser light 20. By means of the electro-optic deflector 29, the exposure device 2B can also change the irradiation position of laser light 20 guided onto the movable optical table 32.

The control mechanism 37 includes the formatter 40 and the driver 30, and controls the irradiation with laser light 20. The driver 30 controls the power of the laser light source 21B on the basis of the control signal generated by the formatter 40. Thereby, the irradiation of the resist layer 15 with laser light 20 is controlled.

Similarly to the exposure device 2A shown in FIG. 8A, the exposure device 2B shown in FIG. 8B dynamically controls the focus of the laser light 20, and synchronizes the control signal of the rotation of the spindle motor 35 and the control signal of the irradiation with laser light 20, as a matter of course.

The first manufacturing method according to the embodiment is described in detail in the above. By the first manufacturing method according to the embodiment, a master 1 in which a concave-convex structure 13 of an arbitrary shape is formed on the outer circumferential surface of the base material 11 can be manufactured.

[2.2. Second Manufacturing Method]

Next, a second manufacturing method according to the embodiment is described with reference to FIG. 9A to FIG. 10.

Specifically, the second manufacturing method differs from the first manufacturing method in that the resist layer 15 is formed on the outer circumferential surface of the base material 11 via an intermediate layer 17. That is, in the second manufacturing method, the resist layer 15 and the intermediate layer 17 form a thin-film layer. Thus, in the second manufacturing method, the resist layer 15 on which a resist pattern is formed is used as a mask to etch the intermediate layer 17, and thereby a thin-film pattern is formed on the resist layer 15 and the intermediate layer 17. Further, the resist layer 15 and the intermediate layer 17 on which a thin-film pattern is formed may be used as a mask to etch the base material 11. Therefore, in the second manufacturing method, the film thickness that can be used as a mask is increased as compared to the first manufacturing method, and accordingly the processing depth of the concave-convex structure 13 in the thickness direction of the base material 11 can be increased. Thus, by the second manufacturing method of the embodiment, a master 1 having a concave-convex structure 13 with a larger processing depth (for example, approximately 1 μm to 10 μm) can be manufactured.

(Outline of Second Manufacturing Method)

The second manufacturing method according to the embodiment will now be described more specifically with reference to FIG. 9A to FIG. 9E. FIG. 9A to FIG. 9E are cross-sectional views describing each step of the second manufacturing method according to the embodiment. FIG. 9A to FIG. 9E schematically show a cross-sectional shape of the base material 11 taken along the thickness direction.

Figure 9A:
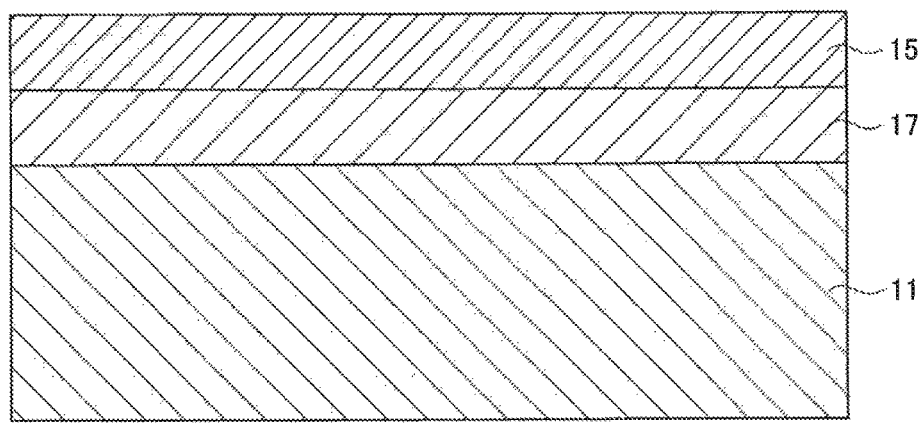
FIG. 9A is a cross-sectional view describing each step of a second manufacturing method according to the embodiment.

First, as shown in FIG. 9A, the intermediate layer 17 is formed on the base material 11 of quartz glass or the like, and the resist layer 15 is formed as a film on the intermediate layer 17, for example.

The intermediate layer 17 is made of silicon, diamond-like carbon (DLC), an organic resist, or the like. In the case where the intermediate layer 17 is silicon or DLC, the intermediate layer 17 may be formed using, for example, the vapor deposition method, the sputtering method, the chemical vapor deposition method (CVD), or the like. In the case where the intermediate layer 17 is an organic resist, the intermediate layer 17 may be formed using, for example, spin coating, slit coating, dip coating, spray coating, screen printing, or the like. Preferred characteristics expected for the intermediate layer 17 to have are described later, The resist layer 15 is made of a heat-reactive resist containing a metal oxide in order to perform thermal lithography. The resist layer 15 may be formed as a film using, for example, the sputtering method.

Figure 9B:
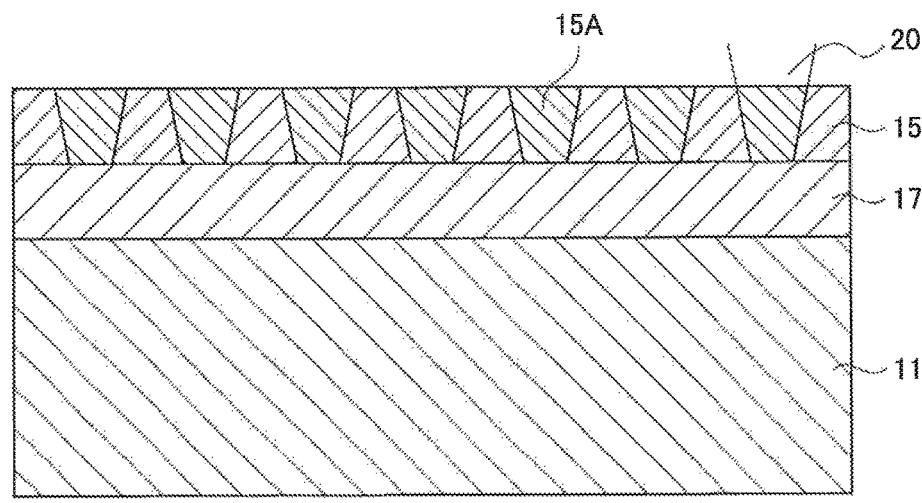
FIG. 9B is a cross-sectional view describing each step of the second manufacturing method according to the embodiment.

Next, as shown in FIG. 9B, the resist layer 15 is exposed to light by an exposure device, and a latent image 15A is formed on the resist layer 15. Specifically, the resist layer 15 is irradiated with laser light 20, and thus the part irradiated with laser light 20 of the resist layer 15 is modified; thereby, a latent image 15A is formed. The exposure device used in this step is similar to the exposure device 2 described in the first manufacturing method, and a description herein is omitted. By using the exposure device described in the first manufacturing method, the resist layer 15 can be irradiated with laser light 20 in the position corresponding to an inputted arbitrary object.

Figure 9C:
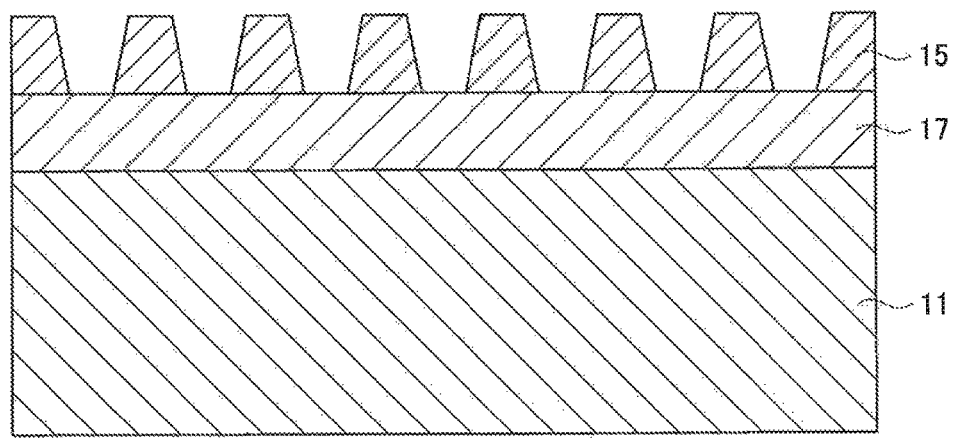
FIG. 9C is a cross-sectional view describing each step of the second manufacturing method according to the embodiment.

Subsequently, as shown in FIG. 9C, a developer is dropped onto the resist layer 15 on which the latent image 15A is formed, and the resist layer 15 is developed. An organic alkaline developer such as tetramethylammonium hydroxide (TMAH) may be used as the developer, for example. Thereby, a resist pattern corresponding to an arbitrary object is formed on the resist layer 15.

Figure 9D:
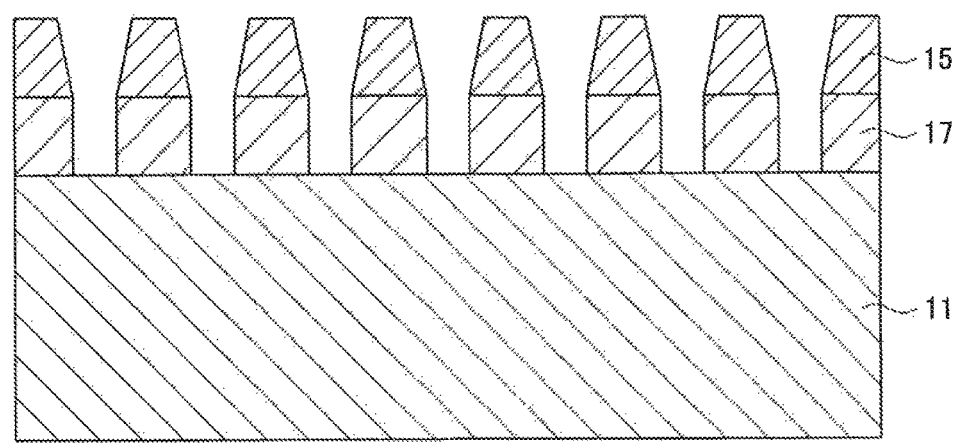
FIG. 9D is a cross-sectional view describing each step of the second manufacturing method according to the embodiment.

Next, as shown in FIG. 9D, a first etching step of etching the intermediate layer 17 using, as a mask, the resist layer 15 on which a resist pattern is formed is performed. Thereby, a thin-film pattern is formed also on the intermediate layer 17. Dry etching may be used for the first etching for the intermediate layer 17. For example, in the case where the material of the intermediate layer 17 is DLC, etching with high vertical anisotropy can be performed by using reactive ion etching (RIE) using oxygen gas.

Figure 9E:
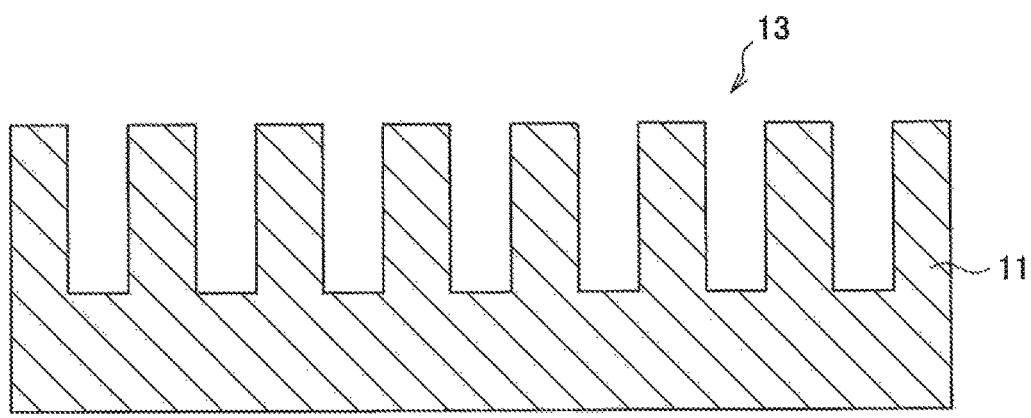
FIG. 9E is a cross-sectional view describing each step of the second manufacturing method according to the embodiment.

Subsequently, as shown in FIG. 9E, a second etching step of etching the base material 11 using, as a mask, the resist layer 15 and the intermediate layer 17 on which a thin-film pattern is formed is performed. Thereby, a concave-convex structure 13 of an arbitrary shape is formed on the base material 11. Dry etching may be used for the etching for the base material 11. For example, in the case where the material of the base material 11 is quartz glass ($SiO_2$), etching with high vertical anisotropy can be performed by using reactive ion etching using a fluorocarbon-based gas.

By the above steps, a concave-convex structure 13 having a shape corresponding to an inputted arbitrary object and having a large processing depth (for example, approximately 1 μm to 10 μm) can be formed on the base material 11.

(Characteristics of Intermediate Layer)

Here, the intermediate layer 17 is preferably made of a material having an etching rate higher than the etching rate of the resist layer 15 in the first etching step and having an etching rate lower than the etching rate of the base material 11 in the second etching step. Specifically, the intermediate layer 17 is preferably an organic layer made of DLC, an organic resist, or the like.

For example, in the case where the resist layer 15 is a heat-reactive resist containing a metal oxide, the organic layer made of DLC, an organic resist, or the like is higher in etching rate than the resist layer 15 during reactive ion etching using oxygen gas. Further, in the case where the material of the base material 11 is quartz glass ($SiO_2$), the organic layer made of DLC, an organic resist, or the like is lower in etching rate than the base material 11 during reactive ion etching using a fluorocarbon-based gas. Hence, in the case where the intermediate layer 17 is an organic layer made of DLC, an organic resist, or the like, the base material 11 can be etched favorably and a master 1 having a concave-convex structure 13 with a large processing depth can be manufactured in the second manufacturing method according to the embodiment.

The intermediate layer 17 is preferably made of a material with a thermal conductivity of less than or equal to 200 W/(m·K). In the second manufacturing method according to the embodiment, the latent image 15A is formed on the resist layer 15 by thermal lithography. Hence, in the case where the thermal conductivity of the intermediate layer 17 is high, there is a possibility that the heat given to the resist layer 15 by the irradiation of the resist layer 15 with laser light 20 will diffuse via the intermediate layer 17 and the latent image 15A cannot be formed. Hence, the thermal conductivity of the intermediate layer 17 is preferably lower, and is preferably specifically less than or equal to 200 W/(m·K). The lower limit value of the thermal conductivity of the material of the intermediate layer 17 is not particularly prescribed, but is preferably larger than 0.

Further, the intermediate layer 17 is preferably made of a material with which the difference between the reflectance of the laser light 20 to the resist layer 15 that is formed directly on the base material 11 and the reflectance of the laser light 20 to the resist layer 15 that is formed on the base material 11 via the intermediate layer 17 is less than or equal to 5%.

Specifically, if the reflectance of the laser light 20 with which the resist layer 15 is irradiated is increased, the proportion of the laser light 20 that contributes to the light exposure of thermal lithography is reduced. Hence, it is preferable that forming the intermediate layer 17 not significantly vary the behavior of the laser light 20 toward the resist layer 15, and the intermediate layer 17 is preferably a material that causes little change in the reflectance of the laser light to the resist layer 15.

In the case Where the exposure device controls the focus of the laser light 20 by detecting the astigmatism of the reflected light of the laser light 20, it is preferable for the intermediate layer 17 not to reduce the amount of reflected light so that the exposure device can detect the reflected light of the laser light 20. Specifically, the intermediate layer 17 is preferably made of a material with which the reflected light from the resist layer 15 does not significantly change depending on the presence or absence of the intermediate layer 17.

Here, in the case where the intermediate layer 17 is not formed and only the resist layer 15 is formed as a film on the base material 11, it is difficult to form a concave-convex structure 13 with a large processing depth (for example, approximately 1 μm to 10 μm) on the base material 11. Specifically, since the latent image 15A is formed on the resist layer 15 by thermal lithography, it is necessary to cause the heat resulting from laser light 20 to spread up to the base material 11 side in the thickness direction of the resist layer 15. Hence, if the resist layer 15 has a film thickness of more than or equal to 100 nm, the heat of the laser light 20 with which the resist layer 15 is irradiated does not spread to the base material 11 side, and an appropriate latent image 15A cannot be formed. Thus, if the resist layer 15 has a film thickness of more than or equal to 100 nm, an appropriate latent image 15A cannot be formed, and the etching of the base material 11 is difficult; consequently, it is difficult to form a concave-convex structure 13 with a large processing depth (for example, approximately 1 µm to 10 µm) on the base material 11.

On the other hand, in the intermediate layer 17, there is no restriction of film thickness like that in the resist layer 15 mentioned above, and therefore an appropriate film thickness can be set on the basis of the processing depth of the concave-convex structure 13 that is to be formed on the base material 11, and a concave-convex structure 13 with a large processing depth can be formed on the base material 11.

The second manufacturing method according to the embodiment is described in detail in the above. By the second manufacturing method according to the embodiment, a master 1 on which a concave-convex structure 13 having a large processing depth in the thickness direction of the base material 11 and having an arbitrary shape is formed can be manufactured.

EXAMPLES

<3. Examples>

The method for manufacturing a master according to the above embodiment will now be specifically described with reference to Examples and Comparative Examples. Examples shown below are examples of the conditions for showing the feasibility and effect of the method for manufacturing a master according to the above embodiment, and the method for manufacturing a master according to the present invention is not limited to Examples below.

[3.1. Investigation of Characteristics of Intermediate Layer]

By the following steps, an intermediate layer and a resist layer were laminated on a base material to manufacture a test piece, and investigation was made on preferred characteristics of the intermediate layer.

Test Example 1

Using chemical vapor deposition (CVD) with a hydrocarbon-based gas, DLC was formed as an intermediate layer with a film thickness of 500 nm on a base material made of quartz glass. Next, using the sputtering method, a tungsten oxide was formed as a resist layer with a film thickness of 55 nm on the intermediate layer; thus, a test piece was manufactured.

Test Example 2

A test piece was manufactured by a similar method to Test Example 1 except that, in place of the DLC in Test Example 1, silicon (Si) was formed with a film thickness of 500 nm by the sputtering method and thus an intermediate layer was formed.

Test Example 3

A test piece was manufactured by a similar method to Test Example 1 except that, in place of the DLC in Test Example 1, aluminum (Al) was formed with a film thickness of 500 nm by the sputtering method and thus an intermediate layer was formed.

Reference Example

A test piece was manufactured by a similar method to Test Example 1 except that the intermediate layer in Test Example 1 was not formed and a resist layer was formed directly on a substrate.

The test pieces according to Test Examples 1 to 3 were irradiated with laser light by an exposure device, and it was investigated whether a latent image was able to be formed. A blue semiconductor laser that emits laser light of a wavelength of 405 nm was used as the laser light source of the light exposure. A 2.38 mass % tetramethylammonium hydroxide (TMAH) aqueous solution was used for development after the light exposure, and development was performed at 27° C. for 900 seconds.

The evaluation results are shown in Table 1 below along with the thermal conductivity of the material of the intermediate layer (literature values). In Table 1, "good" indicates that a pattern was formed after the development and a latent image was able to be formed by being irradiated with laser light. Further, "poor" indicates that a pattern was not formed after the development and a latent image was not able to be formed by being irradiated with laser light.

TABLE 1

|  | Intermediate layer | Thermal conductivity [W/(m · K)] | Pattern formation |
| --- | --- | --- | --- |
| Test Example 1 | DLC | 1 to 10 | Good |
| Test Example 2 | Si | 160 | Good |
| Test Example 3 | Al | 230 | Poor |

Referring to Table 1, it can be seen that, in the test pieces according to Test Examples 1 and 2, the thermal conductivity of the intermediate layer is less than or equal to 200 W/(m·K), and therefore the heat of laser light does not diffuse from the resist layer to the intermediate layer and a latent image can be formed on the resist layer. On the other hand, it can be seen that, in the test piece according to Test Example 3, the thermal conductivity of the intermediate layer is more than 200 W/(m·K), and therefore the heat of laser light diffuses from the resist layer to the intermediate layer and a latent image cannot be formed on the resist layer.

Further, the reflectance of the test pieces according to Test Examples 1 and 3 and Reference Example was calculated for various wavelengths using an optical thin-film coating characteristic calculation software application. TFcalc (Software Spectra, Inc.) was used as the optical thin-film coating characteristic calculation software application. The results of the calculated reflectance are shown in FIG. 10. FIG. 10 is the results of calculation of the reflectance of the test pieces according to Test Examples 1 and 3 and Reference Example. The reflectance shown in FIG. 10 is the reflectance in the case where light is incident in the direction normal to the surface of the test piece.

Figure 10:
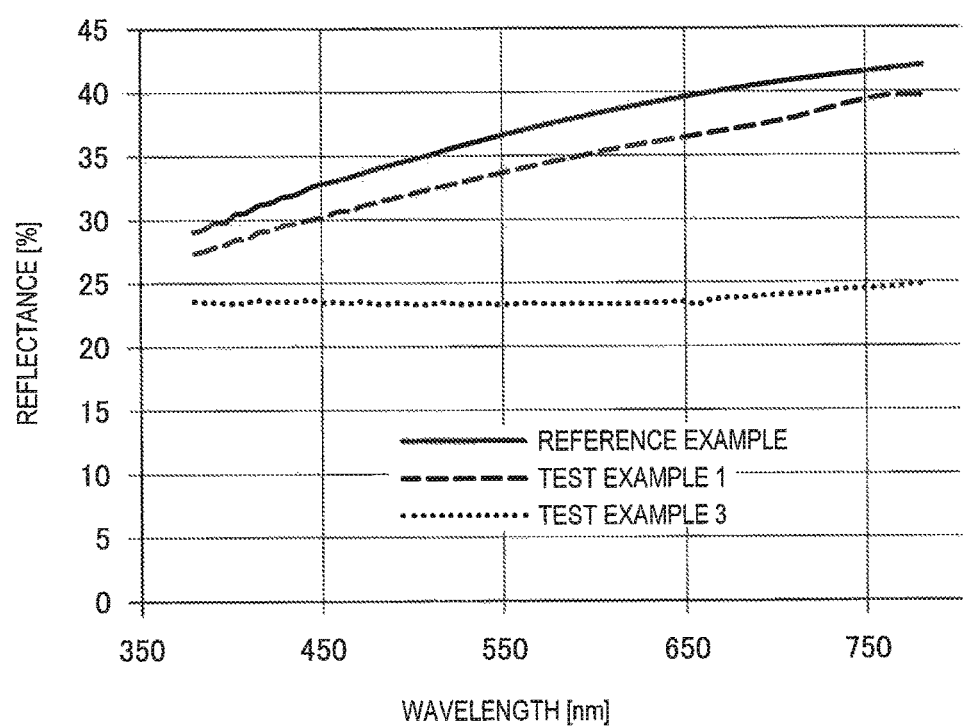
FIG. 10 is results of calculation of reflectance of test pieces according to Test Examples 1 and 3 and Reference Example.

As shown in FIG. 10, the difference between the reflectance of Test Example 1 in which DLC was formed as the intermediate layer and the reflectance of Reference Example in which only the resist layer was formed as a film on the base material was less than or equal to 5% for each wavelength. Therefore, it is found that, in the case where DLC is used as the intermediate layer, the influence on the laser light depending on the presence or absence of the intermediate layer is small. On the other hand, the difference between the reflectance of Test Example 3 in which Al was formed as the intermediate layer and the reflectance of Reference Example in which only the resist layer was formed as a film on the base material was more than 5% for each wavelength. Therefore, it is found that, in the case where Al is used as the intermediate layer, the influence on the laser light depending on the presence or absence of the intermediate layer is large, and consequently light exposure is difficult.

Further, the etching rate in the case where oxygen gas or a fluorocarbon-based gas ($CF_4/CHF_3$ gas) was used as the etching gas was found for each of the intermediate layer (DLC), the resist layer (a tungsten oxide), and the base material (quartz glass) formed as a film in Test Example 1.

The results of finding the etching rate for the layers are shown in Table 2 below. A reactive ion etching (RIE) device was used as the etching device. In the case where $O_2$ gas (flow rate: 30 sccm) was used as the etching gas, the gas pressure was set to 0.5 Pa, and the input electric power was set to 150 W. In the case where $CF_4/CHF_3$ gas (flow rate: 5 sccm/25 seem) was used as the etching gas, the gas pressure was set to 0.5 Pa, and the input electric power was set to 200 W.

TABLE 2

| | Etching rate [nm/min] | | |
|---|---|---|---|
| Etching gas | Tungsten oxide (resist layer) | DLC (intermediate layer) | Quartz glass (base material) |
| $O_2$ | 0.2 | 14 | 1 |
| $CF_4/CHF_3$ | 2.6 | 3 | 13 |

Referring to Table 2, in the step of etching the intermediate layer using the resist layer as a mask, the etching rate of the intermediate layer can be made higher than the etching rate of the resist layer by using $O_2$ gas as the etching gas. Further, in the step of etching the base material using the resist layer and the intermediate layer as a mask, the etching rate of the resist layer and the intermediate layer can be made lower than the etching rate of the base material by using $CF_4/CHF_3$ gas as the etching gas, From the above investigation of the characteristics of the intermediate layer, it is found that the resist layer and the intermediate layer according to Test Example 1 can be suitably used for the second manufacturing method of the embodiment described above.

[3.2. Manufacturing of Masters]

Subsequently, masters were manufactured by the following steps.

Example 1

First, using CVD with a hydrocarbon-based gas, DLC was formed as an intermediate layer with a film thickness of 800 nm on the outer circumferential surface of a base material that was made of quartz glass and had a round cylindrical shape with a thickness of 4.5 mm. Next, using the sputtering method, a tungsten oxide was formed as a film with a film thickness of 55 nm on the intermediate layer.

Subsequently, thermal lithography based on laser light was performed by an exposure device, and thus a latent image was formed on the resist layer. A blue semiconductor laser that emits laser light of a wavelength of 405 nm was used as the laser light source of the exposure device. The base material was rotated at 900 rpm, and light exposure was performed while laser light was scanned at 1.5 μm/second in the axial direction of the base material. An image of a hexagonal lattice arrangement in which circles with a diameter of 4 μm were arranged in a staggered lattice fashion with a pitch of 5 μm was used as the input image (light exposure pattern), and the division interval of the input image was set to 100 nm in both the round direction and the axial direction of the base material. The portions other than the circles with a diameter of 4 μm were exposed to light by the exposure device so that the circle with a diameter of 4 μm corresponded to the convexity. The light exposure time was 45 hours.

Subsequently, the light-exposed base material was developed at 27° C., for 900 seconds using a 2.38 mass % TMAH aqueous solution, and the resist of the light-exposed portion was dissolved.

Further, the first etching step of etching the intermediate layer using the resist layer after development as a mask was performed. In the first etching step, using 02 gas (flow rate: 30 sccm) as the etching gas, reactive ion etching was performed at a gas pressure of 0.5 Pa, with an input power of 150 W, and for 80 minutes. Subsequently, the second etching step of etching the base material using the resist layer and the intermediate layer as a mask was performed. In the second etching step, using CF4 gas (flow rate: 5 sccm) and CHF3 gas (flow rate:25 sccm) as the etching gas, reactive ion etching was performed at a gas pressure of 0.5 Pa, with an input power of 200W, and for 500 minutes.

By the above steps, a master according to Example 1 was manufactured.

Example 2

A master was manufactured by a similar method to Example 1 except that, in place of the input image (light exposure pattern) in Example 1, an image of a tetragonal lattice arrangement in which squares with sides of 3.5 μm were arranged with a pitch of 4.5 μm was used. Like in Example 1, the portions other than the squares with sides of 3.5 μm were exposed to light by the exposure device so that the square with sides of 3.5 μm corresponded to the convexity.

Comparative Example 1

Figure 13A:
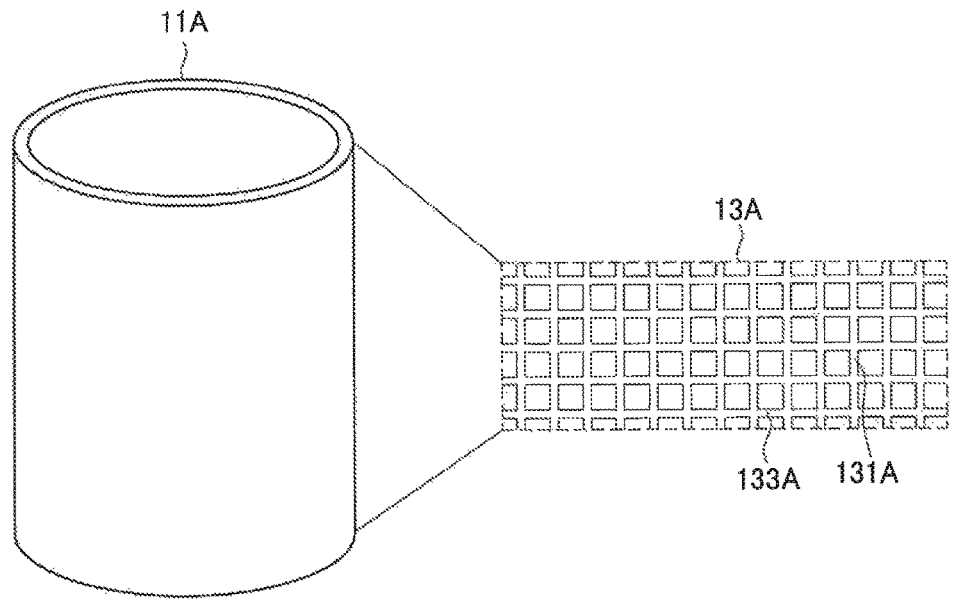
FIG. 13A is an illustration diagram describing a pattern formed on a master according to Comparative Example 1.
Figure 13B:
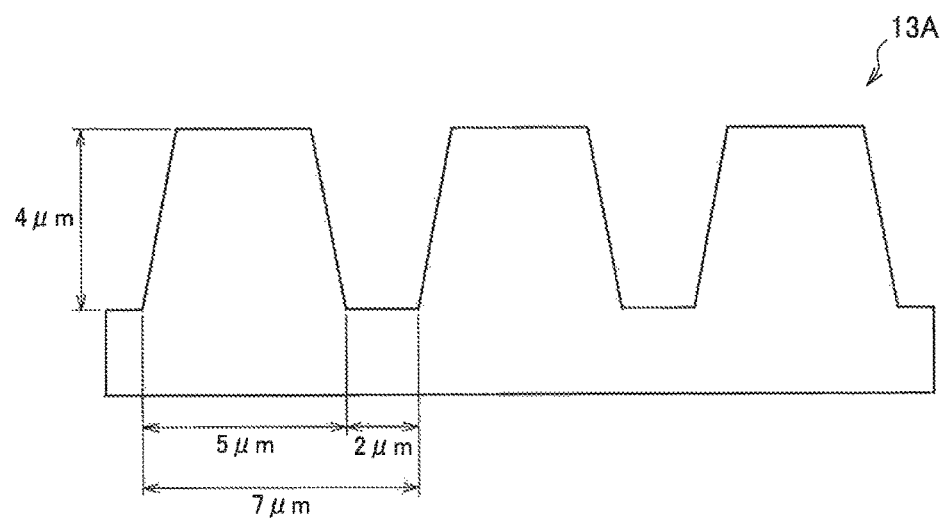
FIG. 13B is a cross-sectional view schematically showing a cross section of the pattern formed on the master according to Comparative Example 1 taken along a thickness direction of a base material.

A master according to Comparative Example 1 was manufactured by ultraprecision cutting, which is a mechanical processing, without using thermal lithography. FIG. 13A is an illustration diagram describing a pattern formed on the master according to Comparative Example 1, and FIG. 13B is a cross-sectional view schematically showing a cross section of the pattern formed on the master according to Comparative Example 1 taken along the thickness direction of the base material.

As shown in FIG. 13A, the master according to Comparative Example 1 is formed of a base material 11A in a round cylindrical shape, and a concave-convex structure 13A is formed on the outer circumferential surface of the base material 11A. The concave-convex structure 13A is composed of, for example, vertical trenches 131A formed at a prescribed interval in the axial direction of the base material 11A and horizontal trenches 133A that are orthogonal to the vertical trench 131A and are formed at a prescribed interval. As shown in FIG. 13B, the vertical trench 131A and the horizontal trench 133A of the master according to Comparative Example 1 were formed in a manner that the trench width was set to 2 μm, the trench pitch was set to 7 μm, and the trench depth was set to 4 μm.

Specifically, first, a nickel phosphorus layer was formed with a film thickness of 200 μm on the outer circumferential surface of a base material made of stainless steel by the plating method. Next, using an ultraprecision lathe, while using a single-crystal diamond tool and rotating the base material, the trenches with a trench width of 2 μm, a trench pitch of 7 μm, and a trench depth of 4 μm described above were formed on the nickel phosphorus layer, with a width of 220 mm in the axial direction. The processing of the base material 11A was performed by two separate steps of the processing of the vertical trench 131A and the processing of the horizontal trench 133A. 47 days was spent to form all the trenches. The single-crystal diamond tool was exchanged 4 to 5 times during the processing due to wearing-out.

[3.3. Evaluation of Masters]

The masters according to Examples 1 and 2 and Comparative Example 1 manufactured by the steps described above were evaluated by transferring the formed concave-convex structure to an ultraviolet (UV) transfer film. The SEM images described below are images of the observation of a transfer copy of the master. Hence, in the concave-convex structure of the pattern of the transfer copy shown below, the positions of the concavity and convexity are inverted with respect to the concave-convex structure of the master.

First, the results of scanning electron microscope (SEM) observation of the transfer copies of the masters according to Examples 1 and 2 are described with reference to FIGS. 11 and 12.

Figure 11:
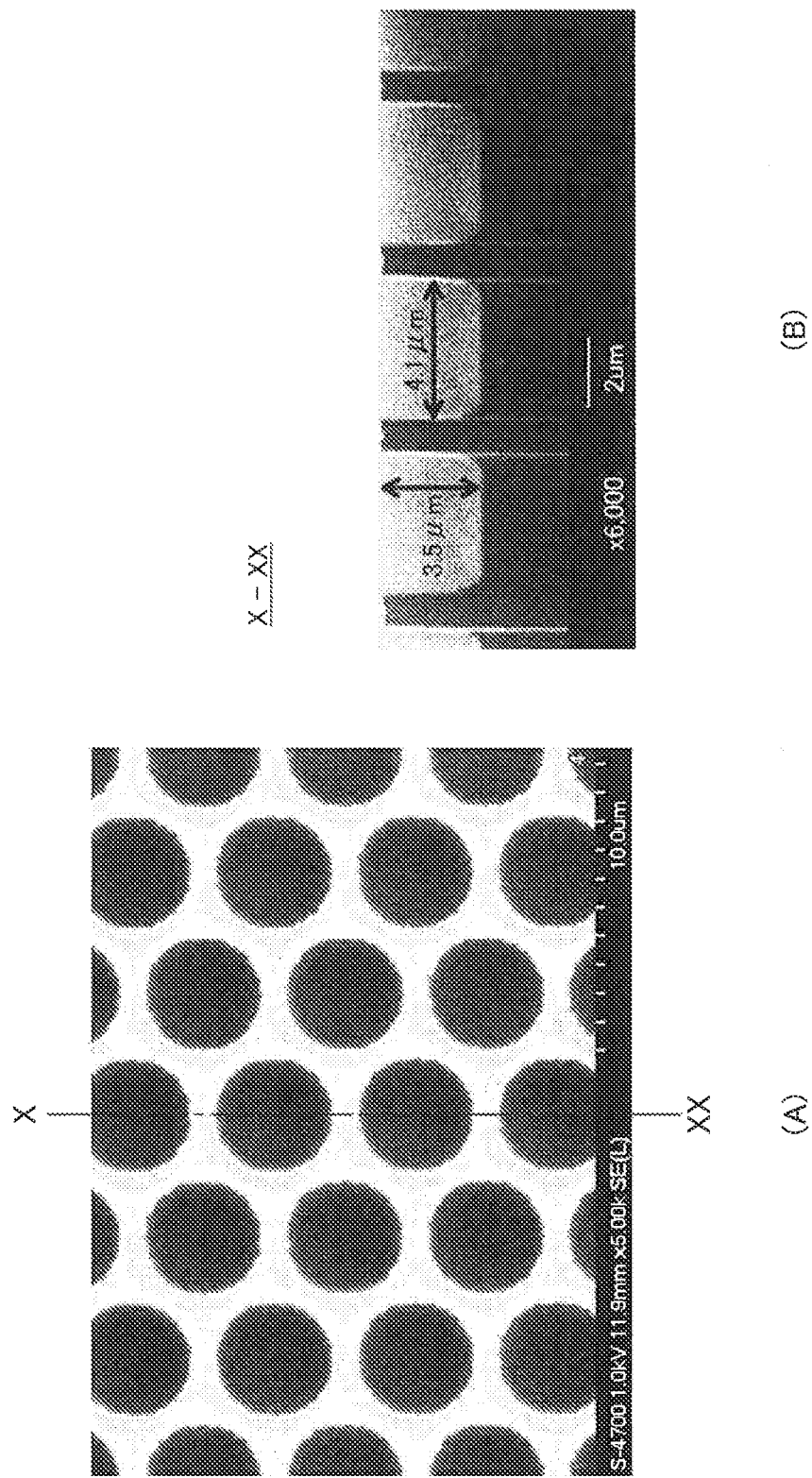
FIG. 11 is results of SEM observation of a transfer copy of a master according to Example 1.
Figure 12:
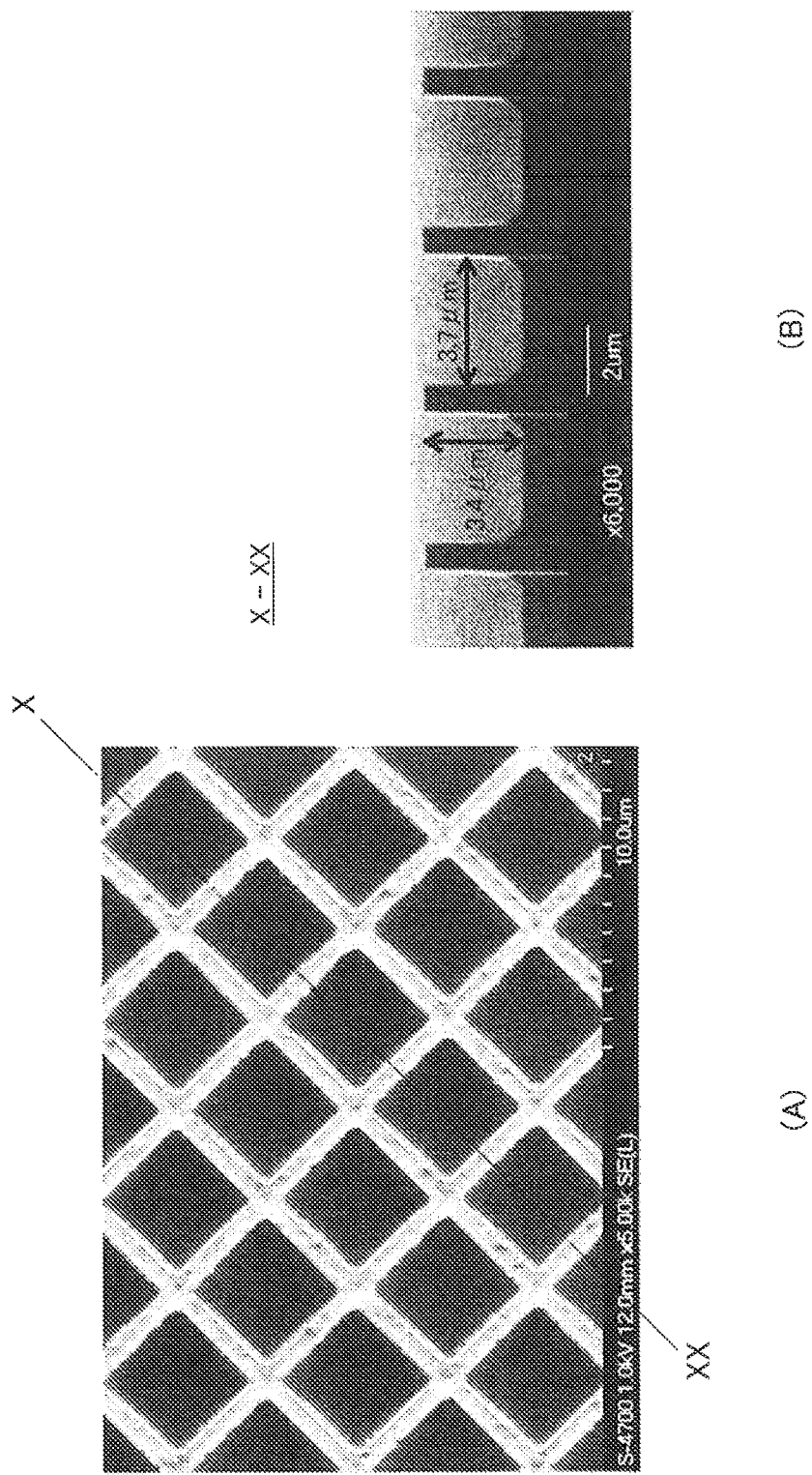
FIG. 12 is results of SEM observation of a transfer copy of a master according to Example 2.

FIG. 11 is SEM images in which the transfer copy of the master according to Example 1 is observed, and FIG. 12 is SEM images in which the transfer copy of the master according to Example 2 is observed. FIG. 11A and FIG. 12A are SEM images in which the upper surface of the transfer copy is observed, and FIG. 11B and FIG. 12B are SEM images in which a cross section of the transfer copy shown in FIG. 11A and FIG. 12A taken along line X-XX is observed.

Referring to FIG. 11A and FIG. 12A, it can be seen that a concave-convex structure having an arbitrary shape inputted to the exposure device is formed on the masters according to Examples 1 and 2. In FIG. 11A and FIG. 12A, the vertical direction of the SEM image corresponds to the round direction of the base material, and the left and right direction corresponds to the axial direction of the base material. Referring to FIG. 11B and FIG. 12B, it can be seen that, in the masters according to Examples 1 and 2, the height of the concave-convex structure is 3.4 μm to 3.5 μm, and a concave-convex structure having a large processing depth of micrometer order has been able to be formed.

Subsequently, the variation of the processing depth of the masters according to Examples 1 and 2 and Comparative Example 1 was investigated. Specifically, the master according to Examples 1 and 2 and Comparative Example 1 was transferred to a UV transfer film, and thus a transfer copy was manufactured. The depth of the manufactured transfer copy was measured with a laser microscope at four places in the round direction and four places in the axial direction, and the maximum variation in depth was calculated. VK 8700 manufactured by Keyence Corporation was used as the laser microscope. In Comparative Example 1, since the depth variation was large, the master was manufactured twice under the same conditions, and the depth variation was investigated for each of them.

The results of depth variation measurement are shown in Table 3 below.

TABLE 3

| | Maximum variation in depth [μm] | Maximum amount of level difference [μm] |
|---|---|---|
| Example 1 | 0.5 | None |
| Comparative Example 1 (1st time) | 1.2 | 1.6 |
| Comparative Example 1 (2nd time) | 1.4 | 1.4 |

Referring to Table 3, it can be seen that the master according to Example 1 in which the concave-convex structure was formed using thermal lithography has a smaller variation in depth than the master according to Comparative Example 1 in which the concave-convex structure was formed using mechanical processing.

For the master according to Comparative Example 1, it has been found that, since the processing was performed separately by the processing of the vertical trench and the processing of the horizontal trench, the processing depth is different between the vertical trench and the horizontal trench and level differences have occurred. Specifically, the level differences that occurred in the master according to Comparative Example 1 were 1.4 μm to 1.6 μm at the maximum. On the other hand, in the master according to Example 1, a level difference was not observed in the concave-convex structure.

Figure 14:
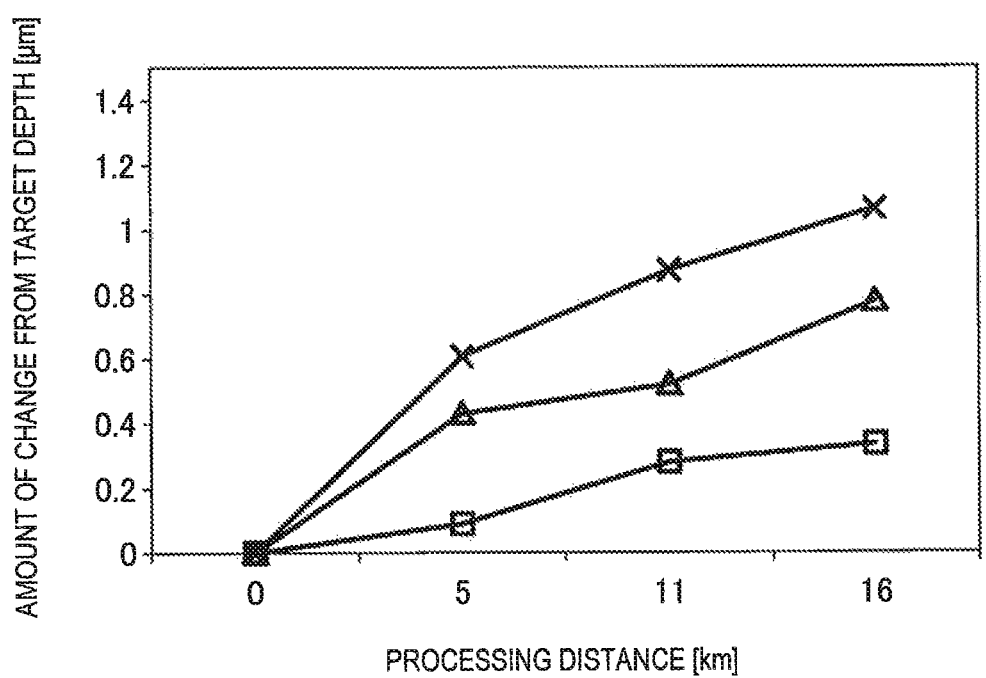
FIG. 14 is a graph showing relationships between a processing distance of single-crystal diamond tools and an amount of change from a target depth.

This is presumed to be because, in the master according to Comparative Example 1, the single-crystal diamond tool used for processing wears out with the progress of processing and the processing depth becomes shallower than the target value. In view of this, the relationship between the processing distance of the single-crystal diamond tool and the amount of change from the target depth was investigated in the master according to Comparative Example 1. The investigation results are shown in FIG. 14. FIG. 14 is a graph showing relationships between the processing distance of the single-crystal diamond tool and the amount of change from the target depth. The □ point, the Δ point, and the × point shown in FIG. 14 correspond to different single-crystal diamond tools.

The relationship between the processing distance of the single-crystal diamond tool and the amount of change from the target depth was investigated by, similarly to the depth variation, measuring the depth of the transfer copy of the master according to Comparative Example 1 with the laser microscope. Specifically, how the depth of the trench formed by each of three single-crystal diamond tools had changed with the processing distance was measured by observing the transfer copy of the master.

As shown in FIG. 14, it has been found that all the single-crystal diamond tools wear out as the processing distance increases, and the processing depth of the trench has become shallower than the target value. Further, it has been found that the degree of progress of wearing-out with respect to the processing distance varies between single-crystal diamond tools. It is presumed that also such a variation between single-crystal diamond tools is a cause of the variation of the processing depth of the master according to Comparative Example 1.

As described hereinabove, by the method for manufacturing a master according to the embodiment, a master on which a concave-convex structure having an arbitrary shape is formed can be manufactured in a short period of time. Furthermore, by the method for manufacturing a master according to the embodiment, a master on which a concave-convex structure having a processing depth of micrometer order is formed can be manufactured. Furthermore, it has been found that, in a master manufactured by the manufacturing method according to the embodiment, the variation of the processing depth of the concave-convex structure can be made smaller than in a master manufactured by ultraprecision cutting, which is another method capable of forming a concave-convex structure having a processing depth of micrometer order.

The preferred embodiment(s) of the present invention has/have been described above with reference to the accompanying drawings, whilst the present invention is not limited to the above examples. A person skilled in the art may find various alterations and modifications within the scope of the appended claims, and it should be understood that they will naturally come under the technical scope of the present invention.

INDUSTRIAL APPLICABILITY

A transfer copy of a master manufactured by the manufacturing method according to the present invention has a concave-convex structure of an arbitrary shape, and can therefore be used for various uses.

For example, the transfer copy can be applied to printed electronics by forming a circuit on the transferred concave-convex structure. As other examples, the transfer copy can be used as a biosensor or a diagnostic device by forming a flow path of a biological sample such as blood on the transferred concave-convex structure. Furthermore, the transfer copy can be applied to an optical element by controlling optical characteristics by means of the transferred concave-convex structure. Moreover, the transfer copy can be applied to a particle array sheet by using the transferred concave-convex structure.

REFERENCE SIGNS LIST 1 master
2 exposure device
11 base material
13 concave-convex structure
15 resist layer
15A latent image
17 intermediate layer
20 laser light
21 laser light source
40 formatter
401 input image acquisition unit
403 small-area division unit
405 signal generation unit
407 clock signal generation unit

The invention claimed is:
1. A method for manufacturing a master, the method comprising:
 forming a thin-film layer on an outer circumferential surface of a base material in a round cylindrical or round columnar shape;
 generating a control signal corresponding to an object on the basis of an input image in which the object is depicted, wherein the input image is divided into a plurality of small areas and the control signal is generated on the basis of a determination for each small area as to whether or not the depicted object is included therein;
 irradiating the thin-film layer with laser light on the basis of the control signal and thereby forming a thin-film pattern corresponding to the object on the thin-film layer, wherein portions of the thin-film layer are either irradiated with the laser light or are not irradiated with the laser light, based on which small areas the object is determined to be included in; and
 forming a pattern corresponding to the object on the outer circumferential surface of the base material using, as a mask, the thin-film layer on which the thin-film pattern is formed.

2. The method for manufacturing a master according to claim 1, wherein
 a size of the small area is smaller than a size of a spot of the laser light.

3. The method for manufacturing a master according to claim 1, wherein
 a light source of the laser light is a semiconductor laser, and
 the thin-film pattern is formed on the thin-film layer by thermal lithography.

4. The method for manufacturing a master according to claim 1, wherein
 the forming the thin-film pattern on the thin-film layer includes irradiating the base material with the laser light while rotating the base material with a center axis of the base material as a rotation axis.

5. The method for manufacturing a master according to claim 4, wherein
 the control signal is generated so as to be synchronized with a signal that controls the rotation of the base material.

6. A transfer copy to which a pattern of a master manufactured by the manufacturing method according to claim 1 is transferred.

7. A replica master to which a pattern of the transfer copy according to claim 6 is transferred.

8. A transfer copy to which a pattern of the replica master according to claim 7 is transferred.

9. The method for manufacturing a master according to claim 1, wherein
 the thin-film layer includes an intermediate layer formed on the outer circumferential surface and a resist layer formed on the intermediate layer, and
 the forming the thin-film pattern on the thin-film layer includes
  developing the resist layer to form the thin-film pattern on the resist layer and
  etching the intermediate layer using the resist layer as a mask.

10. The method for manufacturing a master according to claim 9, wherein
 an etching rate of the intermediate layer is higher than an etching rate of the resist layer, and
 the etching rate of the intermediate layer is lower than an etching rate of the base material.

11. The method for manufacturing a master according to claim 9, wherein
 a thermal conductivity of the intermediate layer is less than or equal to 200 W/(m·K).

12. The method for manufacturing a master according to claim 9, wherein
 a difference between a reflectance of the laser light to the resist layer directly formed on the base material and a reflectance of the laser light to the resist layer formed on the base material via the intermediate layer is less than or equal to 5%.

13. The method for manufacturing a master according to claim 9, wherein
the resist layer contains a metal oxide.

14. The method for manufacturing a master according to claim 9, wherein
the intermediate layer contains diamond-like carbon.

* * * * *